(12) United States Patent
Shay et al.

(10) Patent No.: US 11,711,079 B2
(45) Date of Patent: Jul. 25, 2023

(54) INTEGRATED BUS INTERFACE FALL AND RISE TIME ACCELERATOR METHOD

(71) Applicant: TEXAS INSTRUMENTS INCORPORATED, Dallas, TX (US)

(72) Inventors: Michael John Shay, Fairview, TX (US); Jonathan Lee Valdez, Bedford, TX (US); Kyle Edward Addington, Richardson, TX (US); Padmakumar Menon Nambiyath, Richardson, TX (US); Huang Huanzhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 17/506,092

(22) Filed: Oct. 20, 2021

(65) Prior Publication Data

US 2022/0278684 A1 Sep. 1, 2022

Related U.S. Application Data

(60) Provisional application No. 63/155,147, filed on Mar. 1, 2021.

(51) Int. Cl.
| | | |
|---|---|---|
| *H03K 19/003* | (2006.01) | |
| *H03K 3/012* | (2006.01) | |
| *H04L 25/02* | (2006.01) | |

(52) U.S. Cl.
CPC ....... *H03K 19/00361* (2013.01); *H03K 3/012* (2013.01); *H03K 19/00384* (2013.01); *H04L 25/028* (2013.01)

(58) Field of Classification Search
CPC ........... H03K 19/003; H03K 19/00346; H03K 19/00361; H03K 19/00384; H03K 19/01; H03K 19/017; H03K 3/012
See application file for complete search history.

(56) References Cited

U.S. PATENT DOCUMENTS 5,455,521 A * 10/1995 Dobbelaere ...... H03K 19/01721
326/86
5,614,845 A * 3/1997 Masleid ................. H03K 5/151
327/292

(Continued)

OTHER PUBLICATIONS

Texas Instruments. "TCA9406 2-Bit Bidirectional 1-MHz, I2C Bus and SMBus Voltage-Level Translator with 8-kV HMB ESD." TCA 9406, SCPS221G—Oct. 2010—Revised Nov. 2018. pp 1-37.

(Continued)

*Primary Examiner* — Jason Crawford
(74) *Attorney, Agent, or Firm* — Valerie M. Davis; Frank D. Cimino

(57) ABSTRACT

An integrated circuit includes first and second bus terminals, a pass-gate transistor, first and rising time accelerator (RTA) control circuits, and first and second falling time accelerator (FTA) control circuits. The pass-gate transistor couples between the first and second bus terminals. The first RTA control circuit couples to the first bus terminal, detects a rising edge on the first bus terminal, and accelerates the rising edge on the first bus terminal. The first FTA control circuit couples to the first bus terminal, detects a falling edge on the first bus terminal having a slope below a threshold, and accelerates the falling edge on the first bus terminal. The second RTA and FTA control circuits function similar to the first RTA and FTA control circuits but with respect to the second bus terminal.

20 Claims, 17 Drawing Sheets

(56) References Cited

U.S. PATENT DOCUMENTS

| | | | | |
|---|---|---|---|---|
| 6,025,738 | A * | 2/2000 | Masleid | H03K 19/01721 |
| | | | | 326/83 |
| 6,577,176 | B1 * | 6/2003 | Masleid | H03K 5/151 |
| | | | | 327/212 |
| 7,595,664 | B1 * | 9/2009 | Masleid | H03K 19/00361 |
| | | | | 326/23 |
| 7,646,228 | B1 * | 1/2010 | Masleid | H03K 19/0013 |
| | | | | 327/170 |
| 3,040,171 | A1 | 10/2011 | Welty | |
| 9,710,411 | B2 * | 7/2017 | Maung | G06F 13/385 |
| 2003/0160630 | A1 * | 8/2003 | Earle | H03K 5/1534 |
| | | | | 326/17 |
| 2008/0027820 | A1 | 11/2008 | McMillan et al. | |
| 2014/0292392 | A1 * | 10/2014 | Akahane | H03K 3/012 |
| | | | | 327/333 |
| 2020/0242071 | A1 * | 7/2020 | Maung | G06F 13/4068 |
| 2022/0278684 | A1 * | 9/2022 | Shay | H03K 19/00361 |

OTHER PUBLICATIONS

Texas Instruments. "TCA9416 Ultra-Low-Voltage i2C Translator." TCA9416. SCPS238—Feb. 2021. pp. 1-24.
International Search Report in corresponding PCT Application No. PCT/US2022/018240, dated Jun. 23, 2022 (2 pages).

* cited by examiner

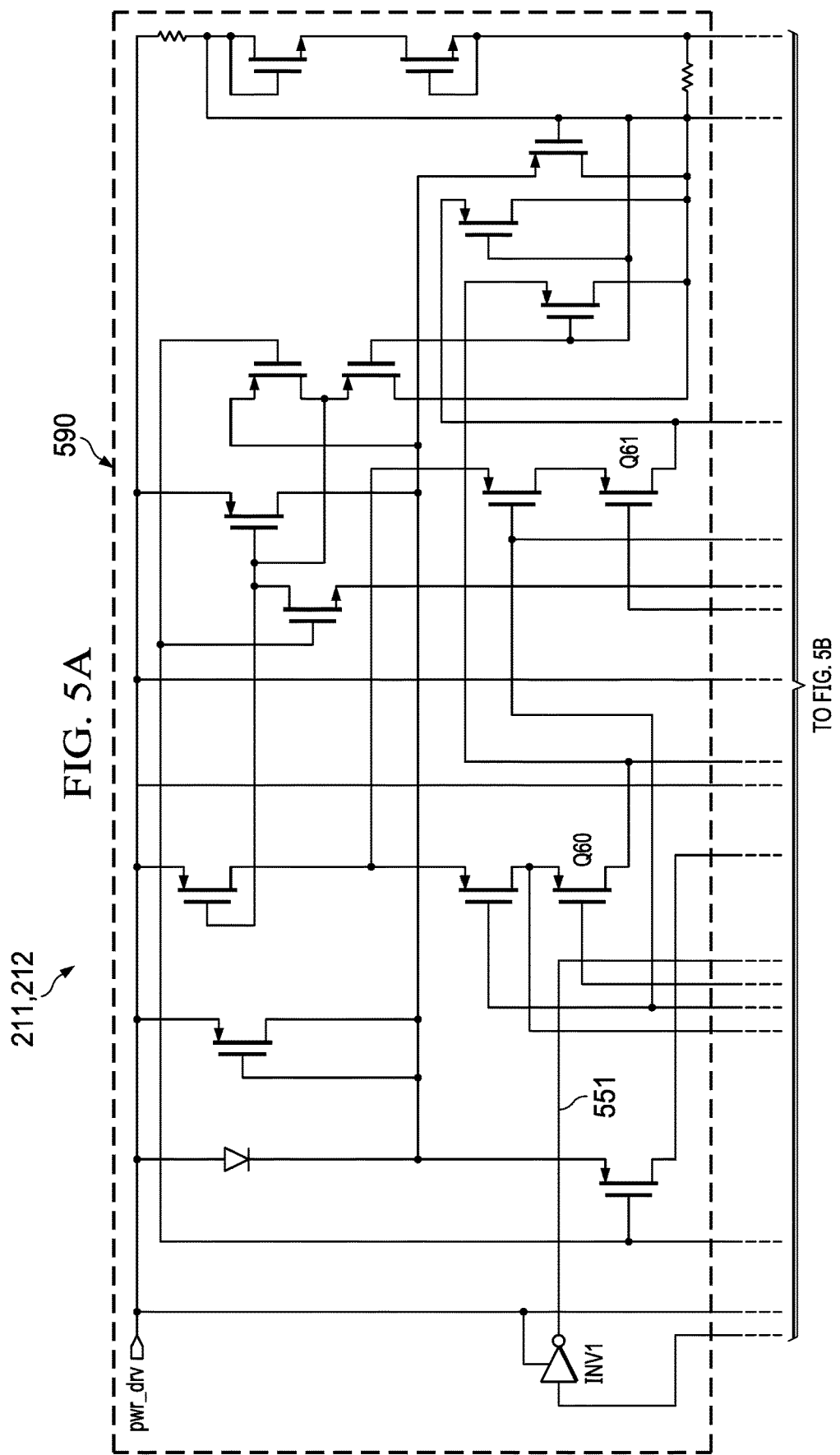

INTEGRATED BUS INTERFACE FALL AND RISE TIME ACCELERATOR METHOD

CROSS-REFERENCE TO RELATED APPLICATIONS

This application claims priority to U.S. Provisional Application No. 63/155,147, filed Mar. 1, 2021, which is hereby incorporated by reference.

BACKGROUND

Electrical busses carry digital signals from one circuit to another (e.g., from one integrated circuit (IC) to another IC). A digital signal includes a series of rising and falling edges. The circuit that generates a digital signal generally generates the digital signal with "sharp" edges (high slew rate signals). However, due to transmission line, loading, and parasitic capacitance effects, such sharp rising and falling edges may be received by a receiving circuit with much lower slew rates. That is, a signal that originated with a sharping rising (or falling) edge is transformed into a signal with a much slower rising (or falling) edge by the time it is received across the bus. Such rising/falling edge degradation can make it difficult for the system of interconnected circuits across the bus to meet timing requirements.

SUMMARY

An integrated circuit includes first and second bus terminals, a pass-gate transistor, first and rising time accelerator (RTA) control circuits, and first and second falling time accelerator (FTA) control circuits. The pass-gate transistor couples between the first and second bus terminals. The first RTA control circuit couples to the first bus terminal, detects a rising edge on the first bus terminal, and accelerates the rising edge on the first bus terminal. The first FTA control circuit couples to the first bus terminal, detects a falling edge on the first bus terminal having a slope below a threshold, and accelerates the falling edge on the first bus terminal. The second RTA and FTA control circuits function similar to the first RTA and FTA control circuits but with respect to the second bus terminal.

BRIEF DESCRIPTION OF THE DRAWINGS

For a detailed description of various examples, reference will now be made to the accompanying drawings in which:

FIGS. 5A and 5B (collectively, "FIG. 5") is a circuit schematic of a rising edge acceleration driver in accordance with an example.

The same reference numbers or other reference designators are used in the drawings to designate the same or similar (functionally and/or structurally) features.

DETAILED DESCRIPTION

The embodiments described herein are directed to an integrated circuit (IC) adapted to be coupled to a bus and including a rising time accelerator (RTA) and a falling time accelerator (FTA). The RTA detects the beginning of a rising edge on the bus and responds to the detected rising edge by actively driving the bus voltage to a high signal level to thereby accelerate the rising edge (increase its slew rate). The FTA detects the beginning of a falling edge on the bus and responds to the detected falling edge by actively forcing the voltage on the bus to a low signal level (e.g., signal ground) to thereby accelerate the falling edge. To avoid crossbar current (current resulting from a low resistance path from a power voltage rail to a ground rail), circuitry is included to prevent both the RTA and the FTA from actively driving the bus high (RTA) and pulling the bus low (FTA) at the same time. For example, upon detection by the FTA of a falling edge, the FTA asserts a control signal to the RTA which prevents/inhibits the RTA from attempting to drive the bus to the high signal level in response to a potential rising edge.

In one embodiment, the RTA and FTA circuits are implemented on an IC adapted to be coupled to an Inter-Integrated Circuit (IIC or I2C) bus. However, the principles, techniques, and circuits described herein can be adapted and applied to other bus protocols besides the IIC bus. In the context of an IIC bus implementation, the RTA and FTA circuits described herein are provided on an IC that also provides voltage translation between IIC devices. For example, one IIC device may have a voltage supply that is 1.8 V while another IIC device operates from 3.3 V. Because two different voltage domains are used, the voltage level of the IIC signals from one device to the other are translated to ensure the receiving device accurately recognizes high and low signaling from the source device.

Figure 1:
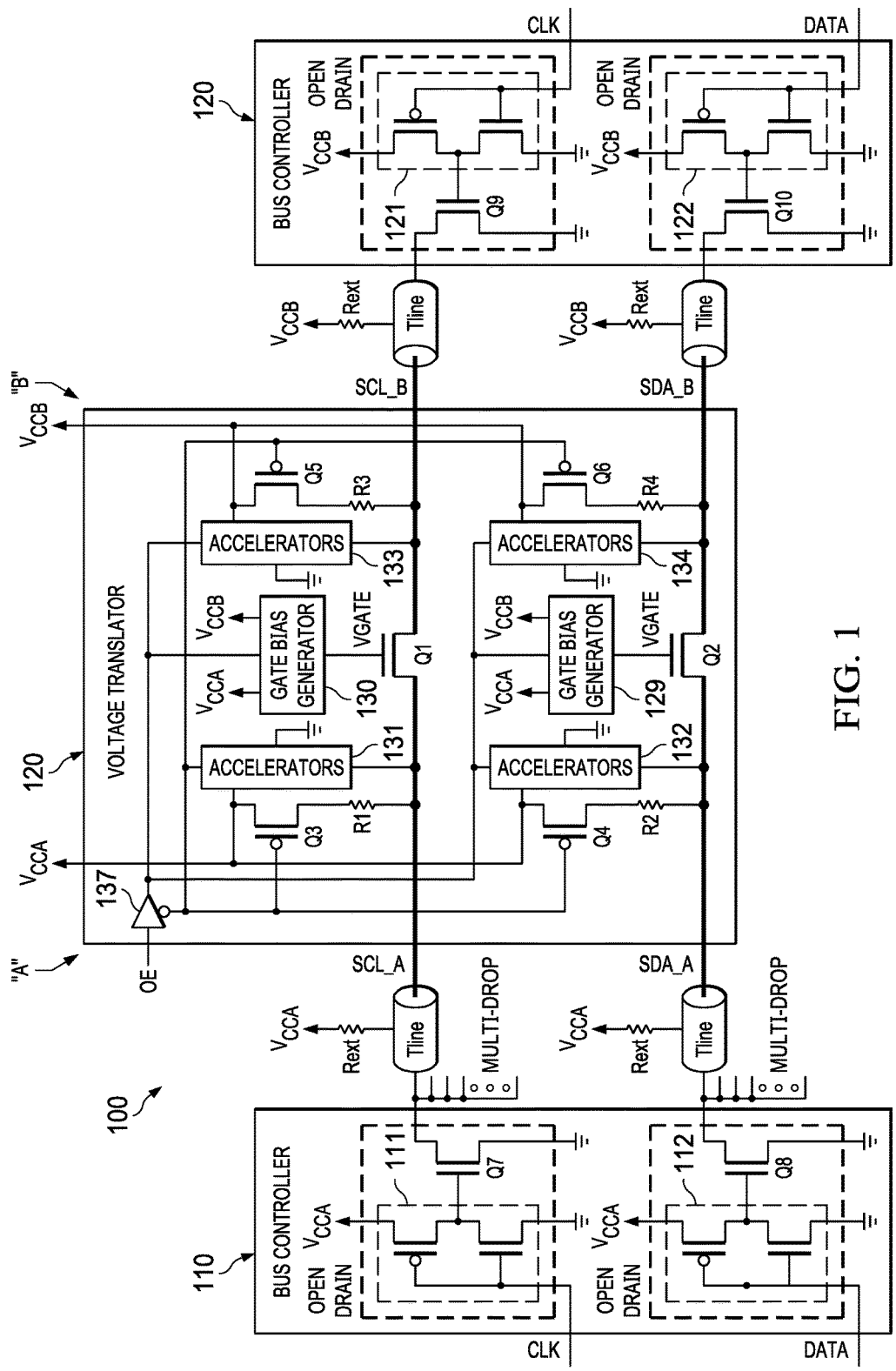
FIG. 1 is a schematic diagram of a system including voltage translators usable to couple together devices across a bus, the voltage translator including rising and falling edge acceleration capability in accordance with an example.

FIG. 1 shows an example system 100 comprising a bus controller 110 coupled to a bus device 120 via a voltage translation device 130. The voltage translation device 130 includes accelerators 131, 132, 133, and 134; pull-up resistors R1, R2, R3, and R4; transistors Q3, Q4, Q5, and Q6; pass-gate transistors Q1 and Q2; and gate bias generators 138 and 139. Transistors Q3-Q4 operate as switches to enable and disable their respective pull-up resistors R1-R4 based on an output enable (OE) signal provided to the voltage translation device 130.

Bus controller 110 operates from a supply voltage labeled VCCA. Bus device 120 operates from a supply voltage labeled VCCB. Each of supply voltages VCCA and VCCB can be a voltage in range from a lower voltage to a higher voltage such as from 1.08 V to 3.6 V. For example, VCCA may be 1.1 V and VCCB may be 3.3 V. Each accelerator 131-134 includes an FTA and an RTA. In this embodiment, the accelerators 131-134 are included as part of an IC that also provides voltage translation. In other embodiments, the FTAs and RTAs may be included within an IC that does not also provide voltage translation.

The embodiment of FIG. 1 is directed to an IIC implementation. The IIC bus (designated as "Tline" on each side of voltage translator 130 in FIG. 1) has a clock signal (SCL) and a data signal (SDA). The voltage translation device 130 includes an "A" side and a "B" side. Any IIC device can be connected to either side (e.g. the "A" side and/or the "B" side) of the voltage translation device 130, because the voltage translation device is symmetrical. The clock and data inputs on the A side of the voltage translation device 130 are labeled SCL_A and SDA_A, respectively. The clock and data inputs on the B side of the voltage translation device 130 are labeled SCL_B and SDA_B, respectively. A pass-gate transistor Q1 is coupled between SCL_A and SCL_B to translate the voltage of the clock signal. A pass-gate transistor Q2 is coupled between SDA_A and SDA_B to translate the voltage of the clock signal.

The voltage translation device 130 also includes a gate bias generator 138 for the pass-gate transistor Q1 and a gate bias generator 139 for the pass-gate transistor Q2. Each gate bias generator 138, 139 generates a gate bias voltage (VGATE) for its respective pass-gate transistor that is the lower of VCCA and VCCB. Each pass-gate transistor Q1 and Q2 turns on when one of its current terminals (drain or source) has a voltage that is at least one threshold voltage (Vth of the respective transistor) below its gate voltage.

The bus connections have an open-drain architecture. For example, bus controller 110 includes transistors Q7 and Q8 whose drains provides the SCL_A clock and SDA_A data signal, respectively. Transistor Q7 receives a control signal from an inverter 111, and transistor Q8 receives a control signal from an inverter 112. A clock signal (CLK) on the input of inverter 111 is logically inverted and the inverted clock controls the gate of open-drain transistor Q7. When CLK is high, the signal on the gate of transistor Q7 is low which turns off Q7. An on-chip pull-up resistor R1 (in combination with external resistor Rext) causes SCL_A to be high. Thus, when CLK is high, SCL_A is high, and when CLK is low, SCL_A is low. Open drain transistor Q8 and its inverter 112 function in a similar fashion for the data signal (DATA, SDA_A). Similarly, the bus device 120 includes transistors Q9 and Q10 whose drains are coupled to the respective clock and data signals as shown. Inverters 121 and 122 invert the clock and data signals produced by the bus device 120 for transmission to the bus controller 110. In this example embodiment, bus device 120 (with respect to the operation of transistors Q9 and Q10) will operate similarly as bus controller 110 (with respect to the operation of transistors Q7 and Q8, as described above).

The pass-gate transistor Q1 and Q2 help to translate the signal voltages between the two different voltage domains of VCCA and VCCB. By way of an example, VCCA may be 1.3V and VCCB may be 3.3 V. The gate bias generators 138 and 139 bias the gates of pass-gate transistors Q1 and Q2 to 1.3 V (the lower of the supply voltages). If bus controller 110 causes its data signal, SDA_A, to be asserted high (close to 1.3V) as facilitated by an optional external pullup resistor Rext to VCCA and/or the internal pullup resistor R2/Q4 to VCCA within voltage translator 130, pass-gate transistor Q2 will be off because the potential difference between the gate (1.3V) and the current terminal voltage connected to side A is not more than the threshold voltage of pass-gate transistor Q2. With pass-gate transistor Q2 being off, the voltage on signal SDA_B will be close to VCCB due to pull-up resistor R4/Q6. Conversely, if bus controller 110 causes its data signal, SDA_A, to be asserted low (close to 0 V), pass-gate transistor Q2 will be turned on. With pass-gate transistor Q2 being on, the voltage on signal SDA_B will be close to 0V. Thus, a high signal level of SDA_A within the voltage domain of VCCA is translated to a high signal level of SDA_B within voltage domain VCCB. Similar functionality applies to the conversion of the voltage levels for the clock signals (SCL_A and SCL_B) and in both signal directions (A to B, and B to A).

Figure 2:
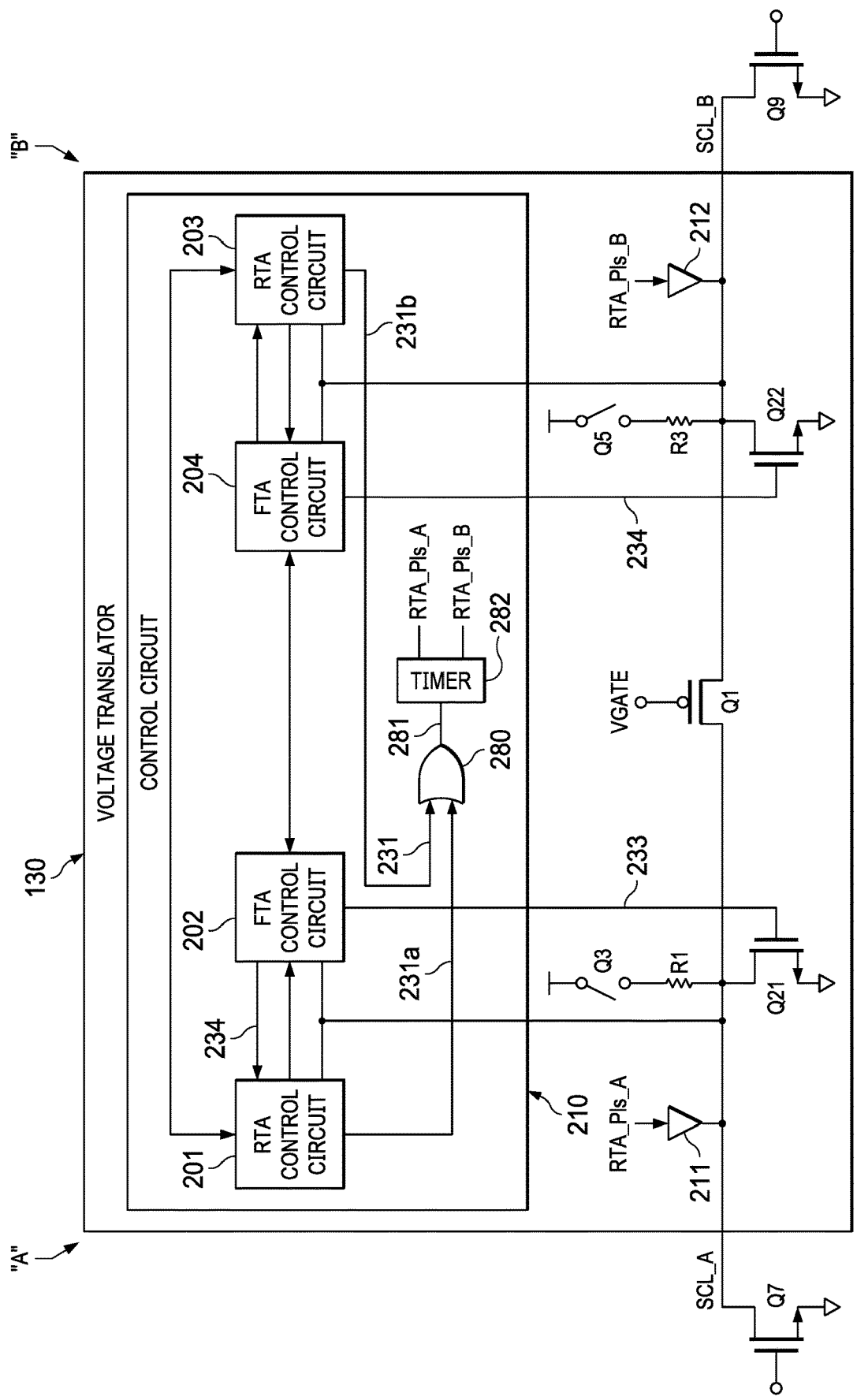
FIG. 2 is a schematic diagram of the voltage translator with rising edge and falling edge acceleration circuitry in accordance with an example.

As noted above, the accelerators 131-134 accelerate (increase the slew rate of) rising and falling edges. FIG. 2 shows a block diagram of at least a portion of the voltage translation device 130. Transistors Q3 and Q5 for the pull-up resistors R1 and R3 are shown symbolically as switches in FIG. 2. The block diagram in FIG. 2 depicts the accelerator circuitry for the clock (SCL) bus signals. A duplicate accelerator circuit is present for the data (SDA) bus signals.

On the A side of the voltage translation device 130, the accelerator circuitry includes an RTA control circuit 201 and associated driver 211 and an FTA control circuit 202 and associated pull-down transistor Q21. Similarly, the acceleration circuitry on the B side of the voltage translation device 130 includes an RTA control circuit 203 and associated driver 212 and an FTA control circuit 204 and associated pull-down transistor Q22. The control circuit 210 further includes a NOR gate circuit 280 and a rising edge pulse timer 282. The RTA control circuits 201 and 203; the FTA control circuits 202 and 204; the NOR gate circuit 280; and the rising edge pulse timer 282 are part of a control circuit 210.

Figure 17:
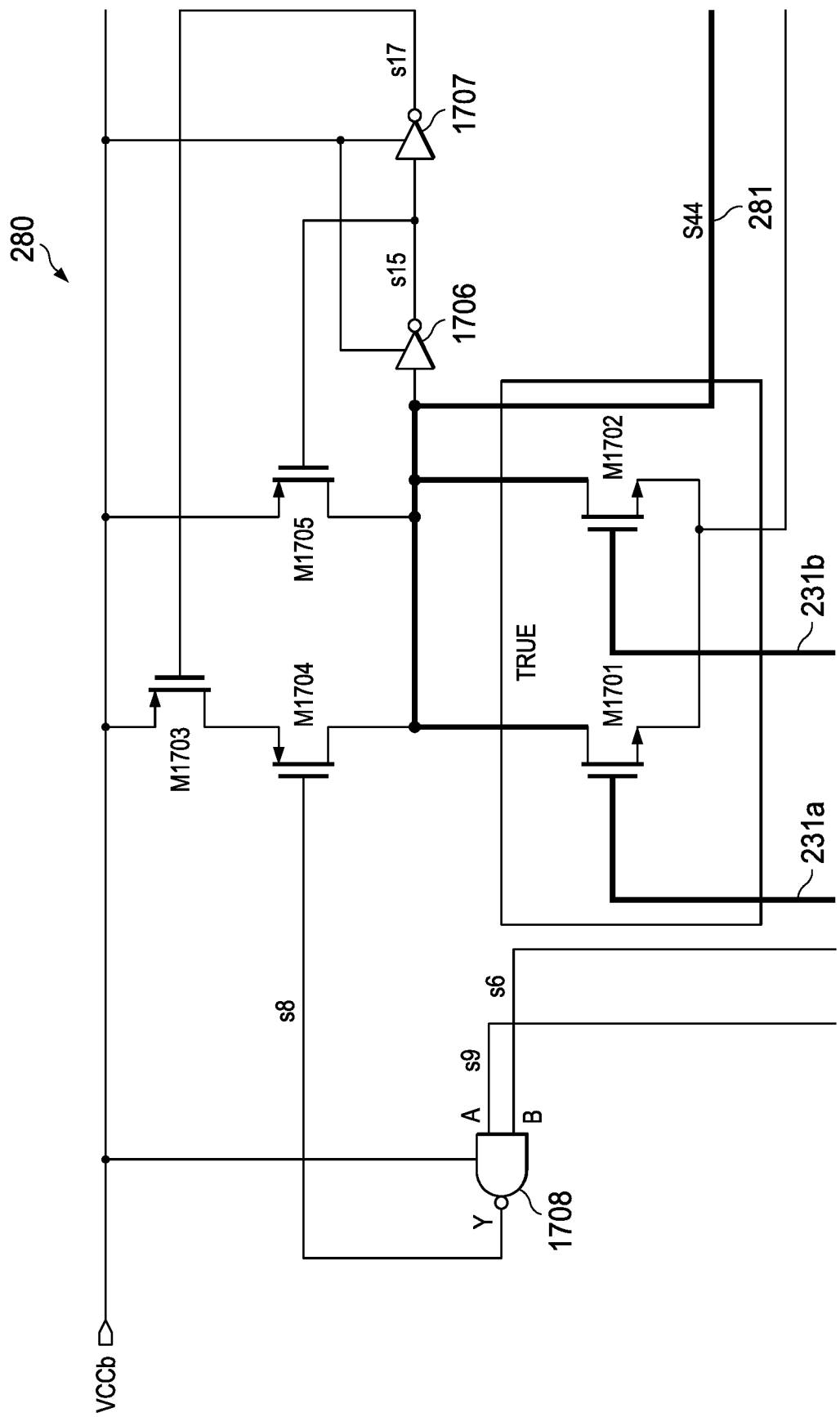
FIGS. 17 and 18 include a schematic of a circuit that provides a timer-based rising edge pulse.
Figure 18:
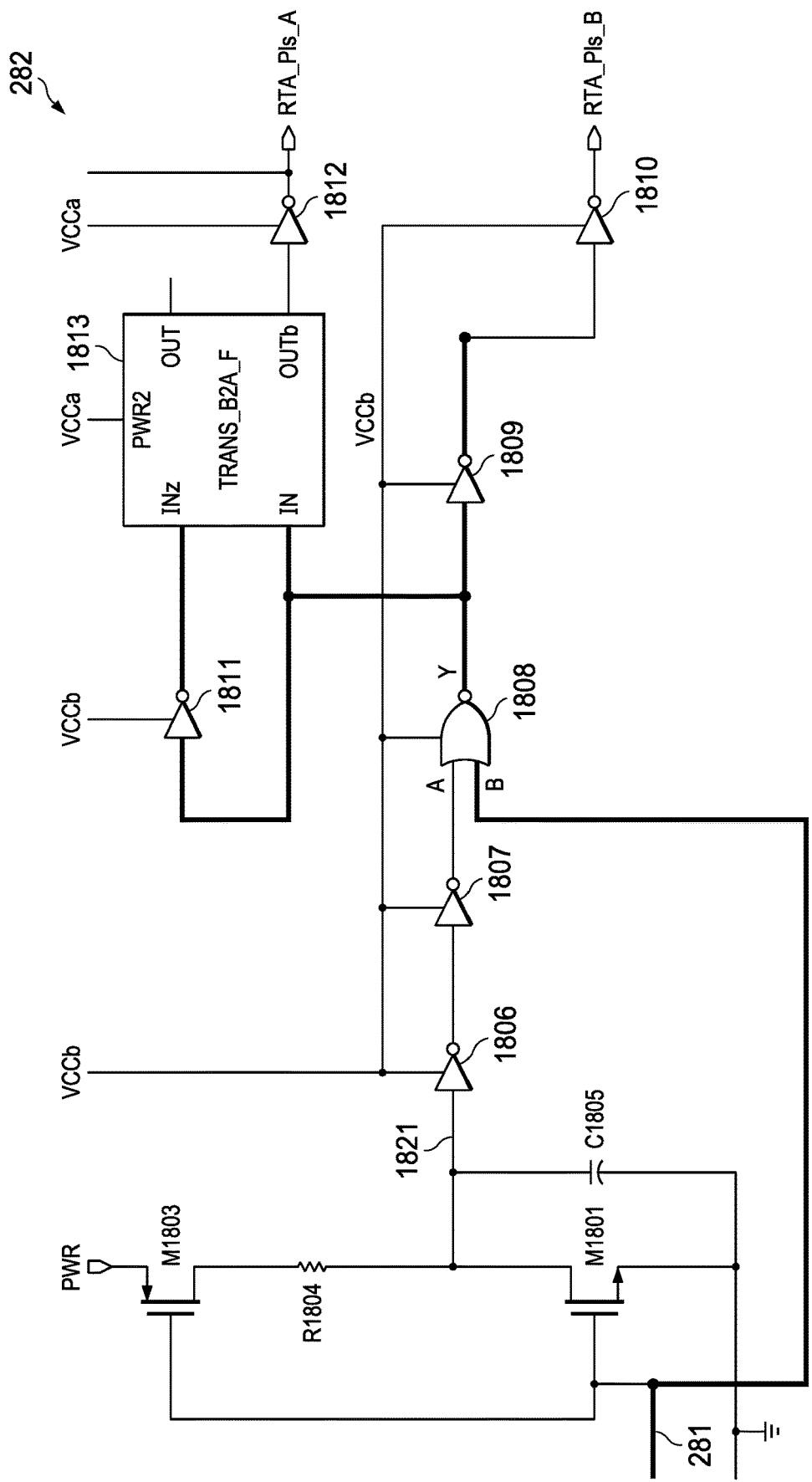

The control circuit 210 also includes corresponding RTA and FTA control circuits (which couple to respective drivers and pull-down transistors) for the SDA data bus signals. The SCL_A signal line is coupled to the RTA and FTA controls circuits 201 and 202 so that those control circuits can detect their respective rising or falling edges on SCL_A. Similarly, the SCL_B signal line is coupled to the RTA and FTA controls circuits 203 and 204 so that those control circuits can detect their respective rising or falling edges on SCL_B. Responsive to the RTA control circuit 201 detecting a rising edge on clock signal SCL_A (which occurs when external transistor Q7 is turned off), the RTA control circuit 201 asserts a control signal 231*a* to an input of NOR gate circuit 280. Similarly, responsive to the RTA control circuit 203 detecting a rising edge on clock signal SCL_B (which occurs when external transistor Q9 is turned off), the RTA control circuit 203 asserts a control signal 231*b* to the other input of NOR gate circuit 280. Either or both of control signals 231*a* or 231*b* being asserted high indicates that a rising edge has been detected on at least one of the busses. The NOR gate circuit 280 responds by asserting an active low signal 281 to the rising edge pulse timer 282 which asserts active high pulses RTA_Pls_A and RTA_Pls_B to the respective drivers 211 and 212 to cause the bus segments to be pulled high even faster than would have been the case due to just the external transistor being turned off. FIGS. 17 and 18 (described below) include an example of a circuit for the implementation of the NOR gate circuit 280 and rising edge pulse timer 282.

Responsive to FTA control circuit 202 detecting a falling edge on clock signal SCL_A (which occurs when external transistor Q7 is turned on), the FTA control circuit 202 asserts a control signal 233 to thereby cause pull-down transistor Q21 to be turned on. FTA control circuit 204 can turn on its respective pull-down transistor Q22 via control signal 234 upon detecting a falling edge on the B side of (SCL_B). With the on-resistance of Q21 in parallel with the on-resistance of Q7, the effective resistance between SCL_A and ground is lower than otherwise would have been the case with only Q7 being on. As a result of turning on Q21, the voltage on SCL_A falls at a faster rate thereby accelerating the falling edge. Also, responsive to the FTA control circuit 202 detecting a falling edge on SCL_A, the FTA control circuit 202 asserts a control signal 234 to the RTA control circuit 201 to prevent/inhibit the RTA control circuit 201 from activating its driver 211 to pull up the voltage of SCL_A. The FTA control circuit 202 starts a timer to "hold off" the RTA control circuit 201 from activating driver 211 until after expiration of the timer. The hold-off time during which the RTA control circuit 201 prevents both the driver 211 and the pull-down transistor Q21 from being simultaneously activated, which otherwise would undesirably cause a high level crow-bar current to flow through driver 211 and transistor Q21 from the power supply rail to ground. The RTA control circuit 203 and the FTA control circuit 204 operate in a similar fashion.

Figure 3:
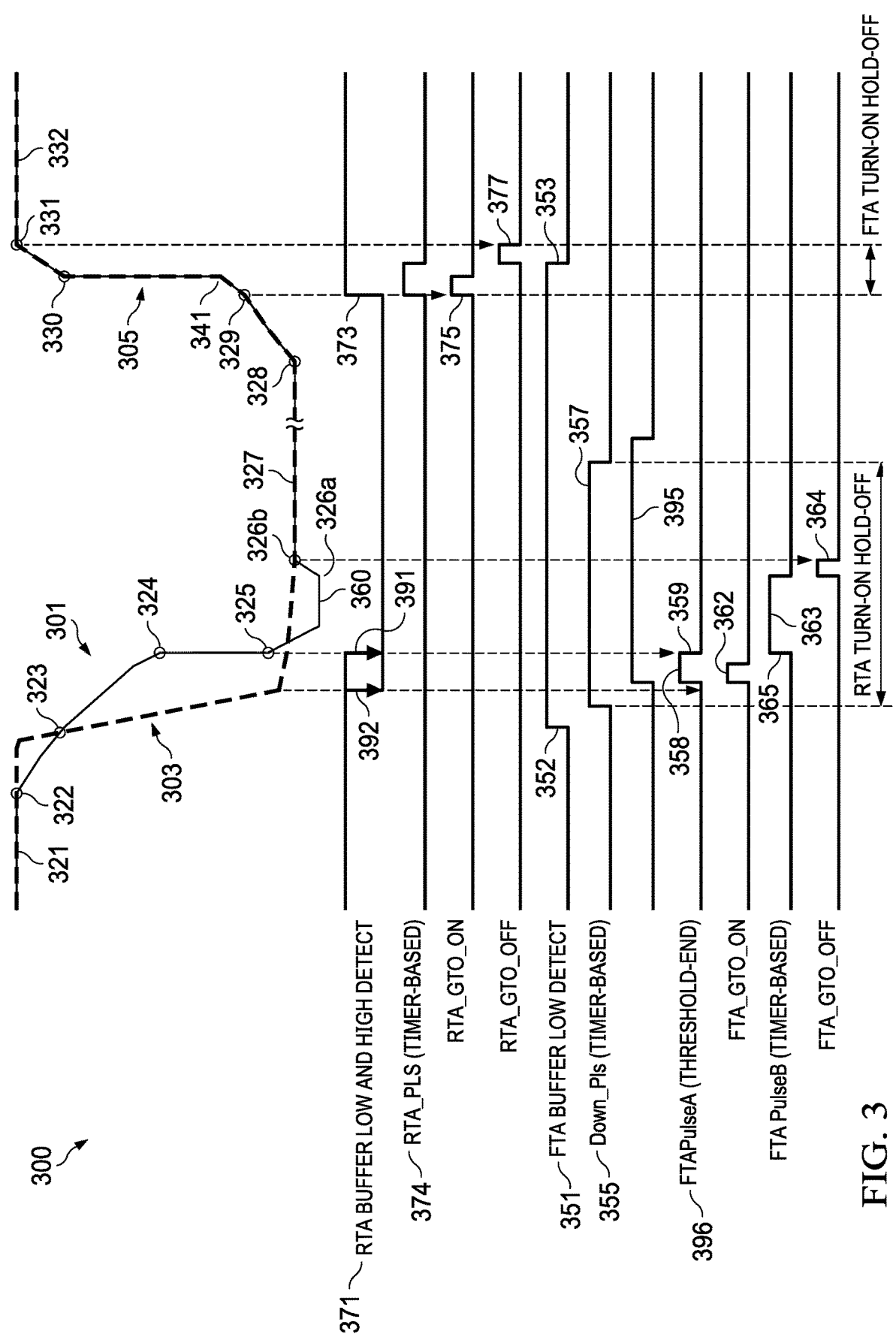
FIG. 3 is a timing diagram illustrating the operation of the rising and falling edge acceleration functionality in accordance with an example.

FIG. 3 is a waveform of the bus voltage 300 including an example of a falling edge 301 and a subsequent rising edge 305, along with a timing diagram for a set of control signals. For ease of explanation, the control signals shown in FIG. 3 are represented with "positive" logic meaning that an asserted signal is at a higher voltage level and an unasserted signal is at a lower voltage level. However, in the detailed schematic examples of the figures described below, one or more of the control signals may implemented with "negative" logic.

The following discussion pertains to a falling edge and subsequent rising edge on SCL_A and the reaction of the FTA and RTA control circuits 201, 202 within control circuit 210, but the discussion applies equally to SDA_A, SCL_B and SDA_B and those bus signals respective falling and rising time accelerator control circuits. FIG. 3 also shows an example of a second falling edge 303, which is substantially faster (higher slew rate) than the falling edge 301. The control circuit 210, described in detail herein, is configured to accelerate a falling edge (e.g., falling edge 301) that is not otherwise falling fast enough (relative to a threshold implemented by the control circuit 210), but does not accelerate a falling edge (e.g., 303) that is falling fast enough with additional falling acceleration assistance from the control circuit 210. The difference in falling speed of slower falling edge 301 versus faster falling edge 303 may be due to a difference in capacitance on the bus, the turn-on resistance of the external transistors, etc.

Reference numerals 321-332 identify various points along the falling and rising edges. At 321, the bus voltage is at a logic high state and the respective external transistor Q7 is off. With external transistor Q7 being off, pull-up resistor R1 pulls the bus voltage to the logic high level as identified by reference numeral 321. On the A side of the voltage translator, and thus with the power supply voltage being at VCCA, the logic high level for the bus voltage will be close to VCCA.

At 322, external transistor Q7 is turned on to initiate falling edge 301 (a discussion of faster falling edge 303 is below). The FTA control circuit 202 detects the falling edge at 323 by the use of a falling edge threshold detector circuit (described below), which asserts an output signal responsive to the bus voltage falling below a threshold voltage corresponding to a voltage input high (VIH) voltage level (i.e., a minimum input voltage level to be recognized as a logic high). The VIH threshold of the falling edge threshold detector circuit may be set at, for example, 70% of VCCA (0.7*VCCA). Accordingly, when the bus voltage falls to 0.7*VCCA, the falling edge threshold detector circuit asserts a signal indicating the detection of the falling edge 301. The FTA control circuit 202 does not immediately turn on pull-down transistor Q21 to accelerate the falling edge because, as noted above, the falling edge may be fast enough without needing additional acceleration assistance (e.g., falling edge 303).

A second threshold is detected for a falling edge. This second threshold (Vil) is a falling edge lower threshold which is identified at 325 in FIG. 3. The falling edge lower threshold is higher than the Vil(max) of the dual-use rising edge detect buffer within the RTA control circuit, 201 or 203. The Vil (min) of the rising edge detect buffer is greater than 0.3*VCCA on the A-side and 0.3*VCCB on the B-side. Accordingly, in one example the falling detection lower threshold is a supply-scaled level and not an absolute voltage. The signal 371 is asserted high until the falling edge lower threshold 325 is reached at which time the signal 371 is forced low, and remains low until a rising edge threshold 329 is detected at which time signal 371 is forced back to a logic high level. As will be described herein, a dual-use buffer (buffer 620, described below) is included that detects both the falling edge lower threshold 325 and the rising edge threshold 329. Accordingly, signal 371 is labeled in FIG. 3 as the RTA Buffer Low and High Detect signal 371. The RTA Buffer Low and High Detect signal 371 transitions high when the falling edge reaches a relatively low level (the falling edge lower threshold 325) and transitions high when a rising edge reaches the rising edge threshold 329.

The FTA control circuit 202 asserts an FTA Buffer Low Detect signal 351 as a high signal level (rising edge 352) in this example. Rising edge 352 coincides with the detection of the falling edge at 323. The falling edge threshold detector circuit implements hysteresis. The VIL voltage threshold (also referred to above as "Vil") is a lower voltage threshold implemented by the falling edge threshold detector circuit. The falling edge threshold detector circuit thus is deasserted at falling edge 353 responsive to the falling edge threshold detector circuit detecting that the bus voltage has risen above its upper threshold voltage. The rising edge 352 of the FTA Buffer Low Detect signal 351 initiates a sequence of events to turn on pull-down transistor Q21 to accelerate the falling edge 301 of the bus voltage. Until the FTA Buffer Low Detect signal 351 is deasserted (at falling edge 353), the FTA control circuit 202 cannot initiate another fall time acceleration even if it detects another falling edge on the bus voltage.

The FTA control circuit 202 includes a down pulse timer (e.g., an RC-based timer) that initiates a signal pulse 357 of a signal labeled Down_Pulse 355. The Down_Pulse signal 355 is an example of the control signal 234 provided to the RTA control circuit 201 (FIG. 2). The assertion at signal pulse 357 of the Down_Pulse signal 355 precludes the RTA control circuit 201 from driving the bus to a logic high level (rising time acceleration) via driver 211 even if the RTA control circuit 201 detects a rising edge on the bus. Signal pulse 357 thus "holds off" the RTA control circuit 201 from accelerating a rising edge should a rising edge otherwise be detected by the RTA control circuit 201.

The Down_Pulse signal 355 serves another purpose as well, which is to hold off turning on falling edge acceleration if the falling edge is already sufficiently fast. As will be explained below, for the FTA control circuit 202 (or 204) to turn on its pull-down transistor Q21 (or Q22) to thereby accelerate a falling edge, at least three conditions must be concurrently true: (1) that the Down_Pulse signal 352 is asserted high (identified at 357), (2) that a delayed version 395 of the asserted high Down_Pulse signal 352 is also asserted high, and (3) that the bus voltage of the falling edge is still above the falling detection lower threshold 325 (which means that the RTA Buffer Low and High Detect signal 371 is logic high). All three signals must be logic high in one example for the FTA control circuit to turn on the corresponding pull-down transistor.

Falling edge 301 is slow enough that the FTA control circuit will determine that the edge should be accelerated. The RTA Buffer Low and High Detect signal 371 remains high until the falling edge 301 falls to the falling edge lower threshold 325 at which time the RTA Buffer Low and High Detect signal 371 becomes low (as identified by falling edge 391). While the RTA Buffer Low and High Detect signal 371 is high, a signal pulse 352 occurs on the FTA Buffer low detect signal 351 and a delayed signal pulse 357 is also high While all three signals are high, an FTA Pulse signal 396 is asserted high for a pulse period of time identified as 358. FTA Pulse signal 396 is high (358) during the time that the RTA Low and High Detect signal 371, the Down_Pls signal 355, and the delayed version 395 of the Down_Pls signal are all three high. The FTA Pulse signal 396 causes the FTA control circuit to turn on the corresponding pull-down transistor (e.g., Q21, Q22).

The FTA control circuits 202, 204, as well as the RTA control circuits 201, 203, implement gradual turn-on and gradual turn-off of the edge acceleration. GTO-ON refers to gradually turning on the acceleration and GTO-OFF refers to gradually turning off the acceleration. At 323, the FTA control circuit 202 implements GTO-ON of the falling edge acceleration as initiated by the FTA_GTO_ON pulse 362. GTO-ON gradually turns on the pull-down transistor Q21, as explained below. The time width of the FTA_GTO_ON pulse 362 is set by a timer. Following the end of the GTO_ON of the falling edge, the FTA control circuit 202 determines that the bus voltage has not fallen fast enough (as described above) and responds by turning on pull-down transistor Q21 to accelerate the falling edge. The FTA_PulseB pulse 363 is also a timer-based pulse during which the pull-down transistor Q21 is on. The rising edge 365 of FTA_PulseB pulse 363 generally coincides with the falling edge 359 of pulse 358. As can be seen in FIG. 3, the slope of the bus voltage increases dramatically starting at point 324 (which coincides with the rising edge of the FTA_PulseB pulse 363) upon pull-down transistor Q21 being turned on. Upon completion of the FTA_PulseB pulse 362, the FTA control circuit 202 generates an FTA_GTO_OFF pulse 364 to implement GTO-OFF of the accelerated falling edge 301. GTO-OFF gradually turns off pull-down transistor Q21. The GTO-ON and GTO-OFF functionality advantageously mitigates ringing on the bus by slowing the change in the current of the RTA and FTA drivers (both turn-on and turn-off currents).

With both the external transistor Q7 and the pull-down transistor Q21 being on, the on-resistance of the transistors are in parallel and, thus, the effective resistance between the bus and ground is lower than otherwise would be the case if Q7, but not Q21, was on. With very little resistance between the bus and ground, the voltage on the bus is pulled to a level at or close to the ground potential as indicated at 360. At 326, the FTA control circuit 202 ends pulse 363 and starts the GTO-OFF phase at which point the resistance between the bus and ground increases (mainly it will be just the on-resistance of external transistor Q7). The bus voltage increases slightly as shown between points 326a and 326b because the pull-up resistor R1 is now forming a voltage divider with a larger source-to-drain resistance (Rds) of transistor Q7 only than with the smaller resistance of the parallel combination of the Rds's of transistors Q7 and Q21.

Falling edge 303 in FIG. 3, however, falls fast enough that falling edge acceleration is not needed. This condition and result is detected as follows. The falling edge 303 decreases to the falling edge lower threshold 325 sooner than for the slower falling edge 301. Accordingly, the RTA Buffer Low and High Detect signal 371 is forced low (falling edge 392) earlier than falling edge 391 for the slower falling edge 301. Accordingly, by the time that the Down_Pls signal 355 is forced high (357), the RTA Buffer Low and High Detect signal 371 is already logic low, and as such, the FTA Pulse signal 396 is not forced high As a result of the lack of a high signal pulse 358, the FTA control circuit does not turn on the corresponding pull-down transistor and the falling edge is not accelerated.

Regardless of whether the falling edge is slow (301) prompting an artificial acceleration or fast (303) not needing an artificial acceleration, the bus voltage remains at a logic low level as indicated by reference numeral 327 until the subsequent initiation of rising edge 305. Rising edge 305 is initiated by turning off external transistor Q7. The RTA control circuit 201 includes a rising edge detector circuit that asserts an output signal (RTA Buffer Low And High Detect 371) responsive to the bus voltage rising above a rising edge detection threshold (identified by reference numeral 329), which may be a VIH voltage threshold (the maximum input voltage recognized as a logic low). The bus voltage exceeding the VIH threshold causes the rising edge detector circuit to assert its output signal (RTA Buffer Low and High Detect 371) to a logic high level at rising edge 373 to initiate a rising time acceleration. Rising edge 373 is provided to the driver 211, and causes the driver to drive the bus to a logic high level first with both a GTO-ON pulse 375, followed by the driver 211 being fully on starting at point 329, and then with a GTO-OFF pulse 377. The GTO-ON pulse 375 causes the bus voltage to rise at a slightly higher rate starting at point 329, than the rate between points 328 and 329. With the driver 211 fully on, the rate at which the bus voltage increases starting at point 341 is larger than the slew rates between points 328 and 329 and between points 329 and 341. The driver 211 includes a timer to drive the bus high for a predetermined period of time while fully on. Following expiration of that timer, the GTO-OFF pulse 377 causes the driver 211 to decrease the slew rate of the rising edge for a period of time between points 330 and 331. Reference numeral 331 identifies the expiration of the GTO-OFF period 377 for the rising edge, followed by the bus voltage remaining at its logic high level (approximately equal to the supply rail VCCA) as indicated by reference numeral 322.

In one embodiment (described below), a single threshold detect circuit is used to detect when, for a falling edge 301, the bus voltage has fallen to the falling detection lower threshold voltage (which is prerequisite for initiating the down pulse 357) and when, for a rising edge, the bus voltage has risen above the rising edge detection threshold (329).

Figure 4:
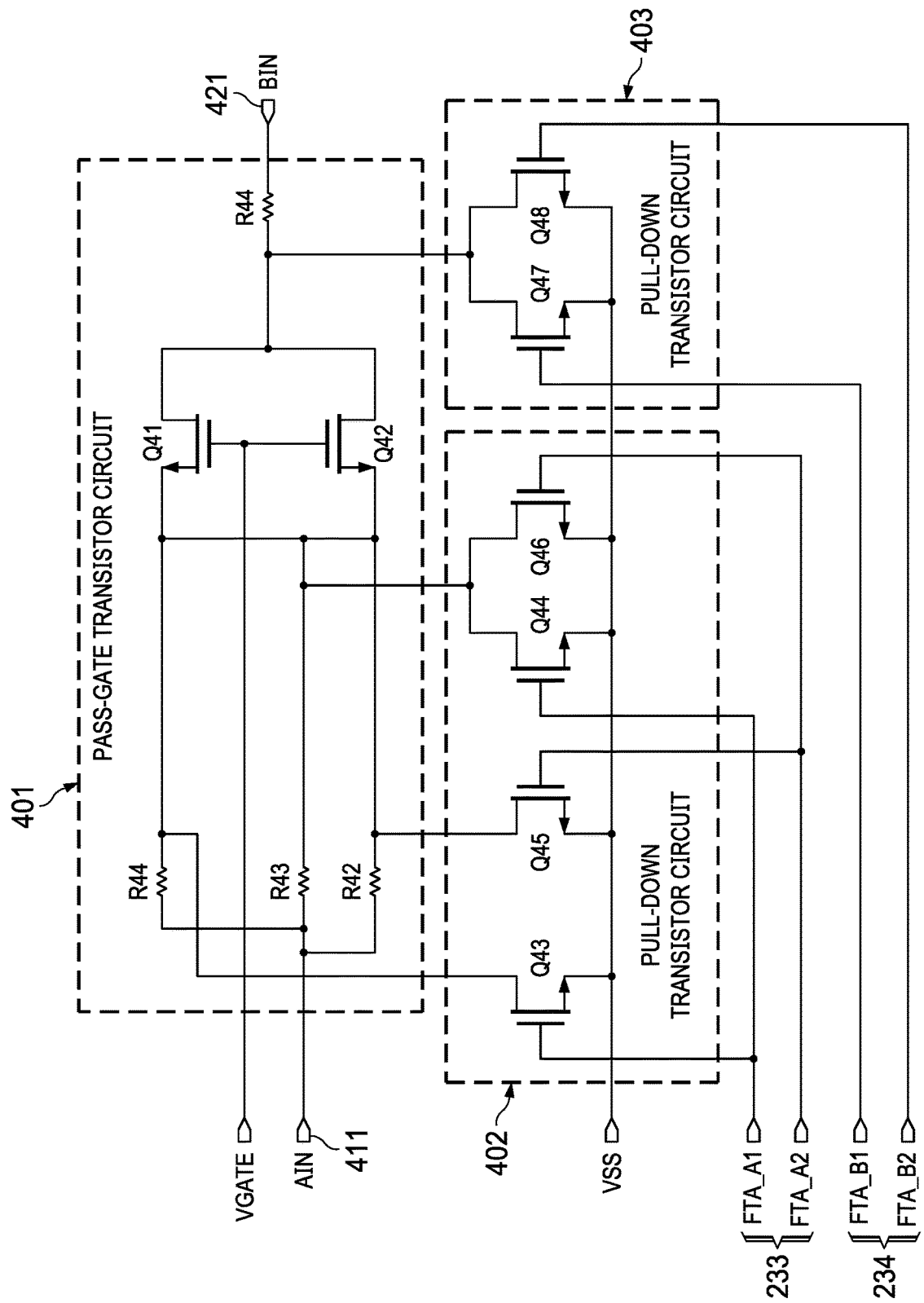
FIG. 4 is a circuit schematic of a pass-gate circuit and pull-down transistor circuits in accordance with an example.

In FIG. 2, the pass-gate transistor is represented as a single transistor Q1 and each of the pull-down transistors Q21 and Q22 are represented as single transistors. While in one embodiment, each of the pass-gate and pull-down transistors for a particular bus line (e.g., SCL or SDA) may be implemented as single transistors, in the example of FIG. 4, such is not the case. FIG. 4 shows an example pass-gate transistor circuit 401 and pull-down transistor circuits 402 and 403.

The example pass-gate circuit 401 of FIG. 4 includes a pair of N-type metal oxide semiconductor field effect transistors (NMOS transistors) Q41 and Q42 and resistors R41, R42, R43, and R44. The A-side input to the pass-gate circuit 401 is AIN 411, and the B-side input is BIN 421. Resistors R41-R43 are coupled in parallel between AIN 411 and the sources of transistors Q41 and Q42. Resistor R44 is coupled between BIN 421 and the drains of transistors Q41 and Q42. The gates of transistors Q41 and Q42 are coupled together and receive the gate bias voltage VGATE. As explained above, VGATE is the lower of VCCA and VCCB. Responsive to the voltage of AIN 411 being low (at least a threshold voltage, Vt, below VGATE), transistors Q41 and Q42 will be on thereby pulling BIN 421 low as well. Responsive to AIN 411 being high, transistors Q41 and Q42 will be off and BIN 421 will be pulled by its respective pull-up resistor R3 (FIG. 2).

Pull-down transistor circuit 402 includes a pair of NMOS transistors Q43 and Q44, and another pair of NMOS transistors Q45 and Q46. The sources of transistors Q43-Q46 are coupled together and to a ground node (VSS). The gates of transistors Q43 and Q44 are coupled together and thus are driven by the same signal, FTA_A1. Similarly, the gates of transistors Q45 and Q46 are coupled together and are driven by the same signal, FTA_A2. Control signal 233 from the FTA control circuit 202 includes signals FTA_A1 and FTA_A2. The FTA control circuit 202 implements gradual turn on and off of the pull-down transistor circuit 402. To gradually turn on the pull-down transistor circuit 402, the FTA control circuit 402 first turns on transistors Q43 and Q44 without also turning on transistors Q45 and Q46 (or turning on transistors Q45 and Q46 without also turning on transistors Q43 and Q44). Then, to fully turn on the pull-down transistor circuit 402, transistors Q45 and Q46 are also turned on at which point all four transistors Q43-Q46 are on. Gradual turn off is performed by the FTA control circuit 202 turning off one pair of transistors (Q43/Q44 or Q45/Q46), and then turning off the other pair. A timer is included as part of the FTA control circuit 202 to control the time duration of the gradual turn on and off operations.

Pull-down transistor circuit 403 includes a pair of NMOS transistors Q47 and Q48. The sources of transistors Q47 and Q48 are coupled together and to VSS. Control signal 234 from FTA control circuit 204 includes signals FTA_B1 and FTA_B2. The gate of transistor Q47 driven by signal FTA_B1, and the gate of transistor Q48 is driven by signal FTA_B2. The FTA control circuit 204 implements gradual turn on of the pull-down transistor circuit by turning on transistor Q47 without also turning on transistor Q48 (or vice versa). Then, to fully turn on the pull-down transistor circuit 403, transistor Q48 is also turned on at which point both of transistors Q47 and Q48 are on. Gradual turn off occurs by first turning off one of transistors Q47 and Q48 and then turning off the other of the transistors. A timer is included as part of the FTA control circuit 204 to control the time duration of the gradual turn on and off operations.

Figure 5B:
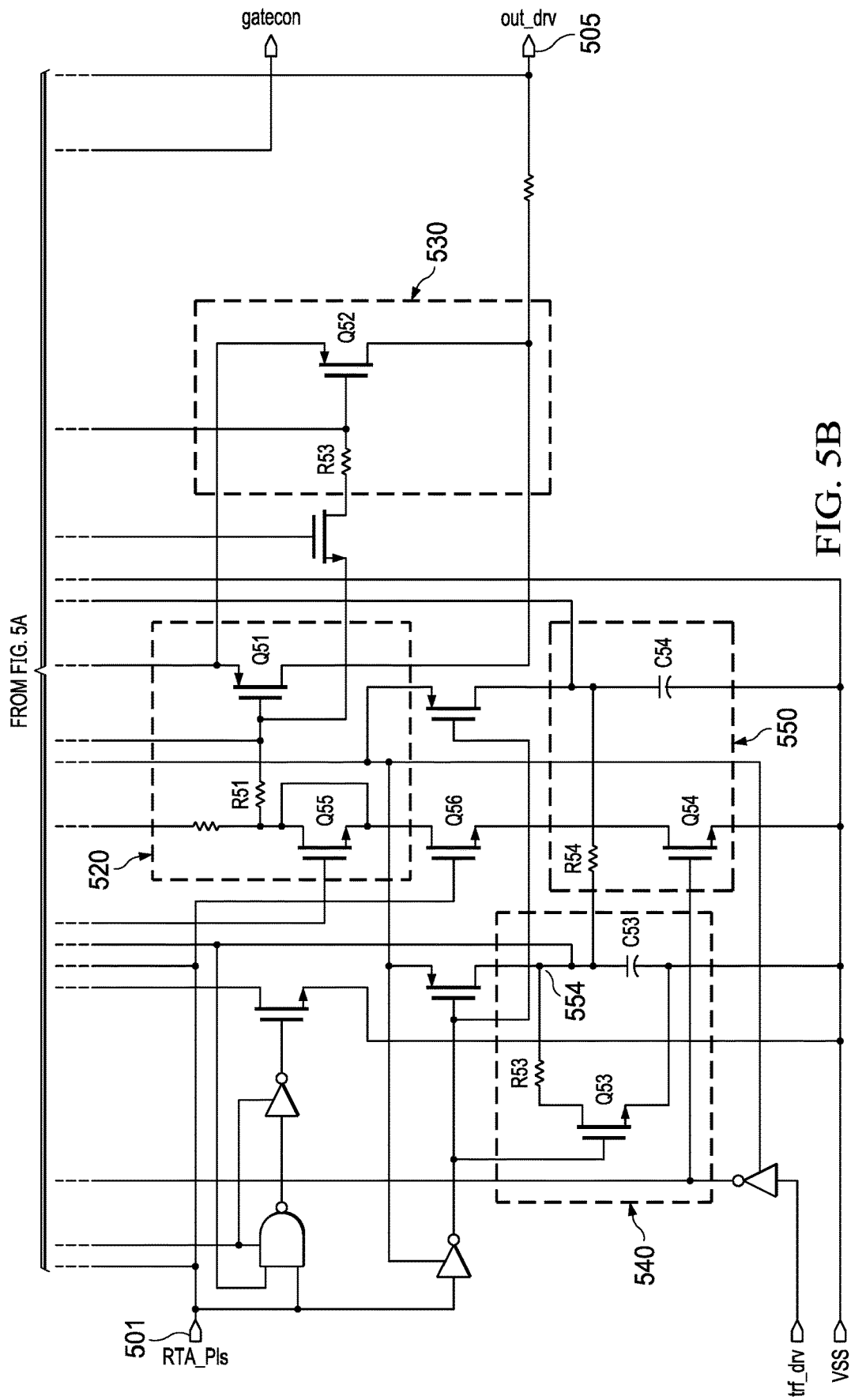

FIG. 5 is an example circuit that can be used to implement each of the RTA drivers 211 and/or 212 to accelerate the respective bus to a higher voltage upon detection by the RTA control circuits 201 and 203 of a rising edge. The rising edge pulse timer 282 (FIG. 2) generates an RTA one-shot pulse to each driver 211, 212. RTA_Pls_A is a one-shot pulse provided to driver 211, and RTA_Pls_B is a one-shot pulse provided to driver 212. The input to the circuit example of FIG. 5 is labeled RTA_Pls, and that signal is RTA_Pls_A for driver 211 and RTA_Pls_B for driver 212. The output of the driver of FIG. 5 (e.g. driver 211 and/or 212) is the OUT_DRV output 505 which is connected to the respective bus (SCL, SDA). The driver 211, 212 includes circuitry (such as that shown in the example of FIG. 5) to drive the bus to the higher voltage level to thereby accelerate a detected rising edge.

The driver's circuitry includes a two-stage GTO-ON circuit and a two-stage GTO-OFF circuit. The two-stage GTO-ON circuit includes a first stage GTO-ON circuit 520 and a second stage GTO-ON circuit 530. The two-stage GTO-OFF circuit includes a first stage GTO-OFF circuit 540 and a second stage GTO-OFF circuit 550. The first stage GTO-ON circuit 520 includes a resistor R51 coupled to the gate of a p-type metal oxide semiconductor field effect transistor (PMOS transistor) Q51. The second stage GTO-ON circuit 530 includes a resistor R53 coupled to the gate of a PMOS transistor Q52. The drains of transistors Q51 and Q52 are coupled to the OUT_DRV output 505. When each respective transistor Q51, Q52 is on, the voltage on the OUT_DRV output 505 is forced to a higher voltage level through the transistor.

The GTO-ON stages 520 and 530 function as follows. Responsive to RTA_Pls 501 becoming logic high, transistors Q54, Q55, and Q56 are all on (the gate of transistor Q56 receives RTA_Pls 501). What happens is that the gate of Q51 starts to slowly pulldown based on the RC time constant of the gate capacitance of transistor Q51 in series with the resistance of resistor R51 (first stage 520). The second GTO-ON stage 530 implements an RC time constant that is a function of the gate capacitance of transistor Q52 in series with the sum of the resistances of resistors R52 and R51. In one example, transistor Q52 is approximately the same size as transistor Q51, and thus their gate capacitances are approximately equal. Accordingly, the time constant of GTO-ON stage 530 is larger than the time constant of GTO-ON stage 520.

The first stage GTO-OFF circuit 540 includes a resistor R53 coupled to the drain of an NMOS transistor Q53 and to a capacitor C53. The second stage GTO-OFF circuit 550 includes a resistor R54 coupled to a capacitor C54. The GTO-OFF stages 540 and 550 function as follows. RTA_Pls 501 is provided to, and inverted by, inverter INV1. Responsive to RTA_Pls 501 transitioning from high to low, the output signal 551 from inverter INV1 transitions from low to high. The output signal 551 from inverter INV1 drives the gate of transistor Q55 to a logic high thereby turning on transistor Q55. This then pulls node 554 slowly to ground due to the time constant implemented by resistor R43 and capacitor C53. The voltage on node 554 is the gate voltage of PMOS transistor Q60 and thus transistor Q60 slowly turns on. The drain of transistor Q60 is coupled to the gate of transistor Q51 and thus the gate of transistor Q51 is driven high, thereby turning off transistor Q5. This is the first stage of the GTO-OFF function. The second stage GTO-OFF is created by a second order low pass filter including resistor R53 and capacitor C53 in series with a low-pass filter comprising resistor R54 and capacitor C54. The output of the low-pass filter comprising resistor R54 and capacitor C54 is coupled to the gate of transistor Q61 (e.g. a PMOS transistor). The low-pass filter comprising resistor R54 and capacitor C54 slowly turns on transistor Q61. With transistor Q61 slowly turning on, the voltage on the drain of transistor Q61 drain also slowly increases which slowly increases the voltage on the gate of transistor Q55. This is the second stage GTO-off function.

The drivers 211 and 212 include a fail-safe circuit 590. The fail-safe circuit 590 protects the supply rail that the I2C high-side driver and resistive pullup is coupled to from being driven up by an external potential on the I2C bus. Without the fail-safe circuit 590, the powered down IC could undesirably load down the I2C bus and potentially experience a partial powered rail condition.

Figure 6:
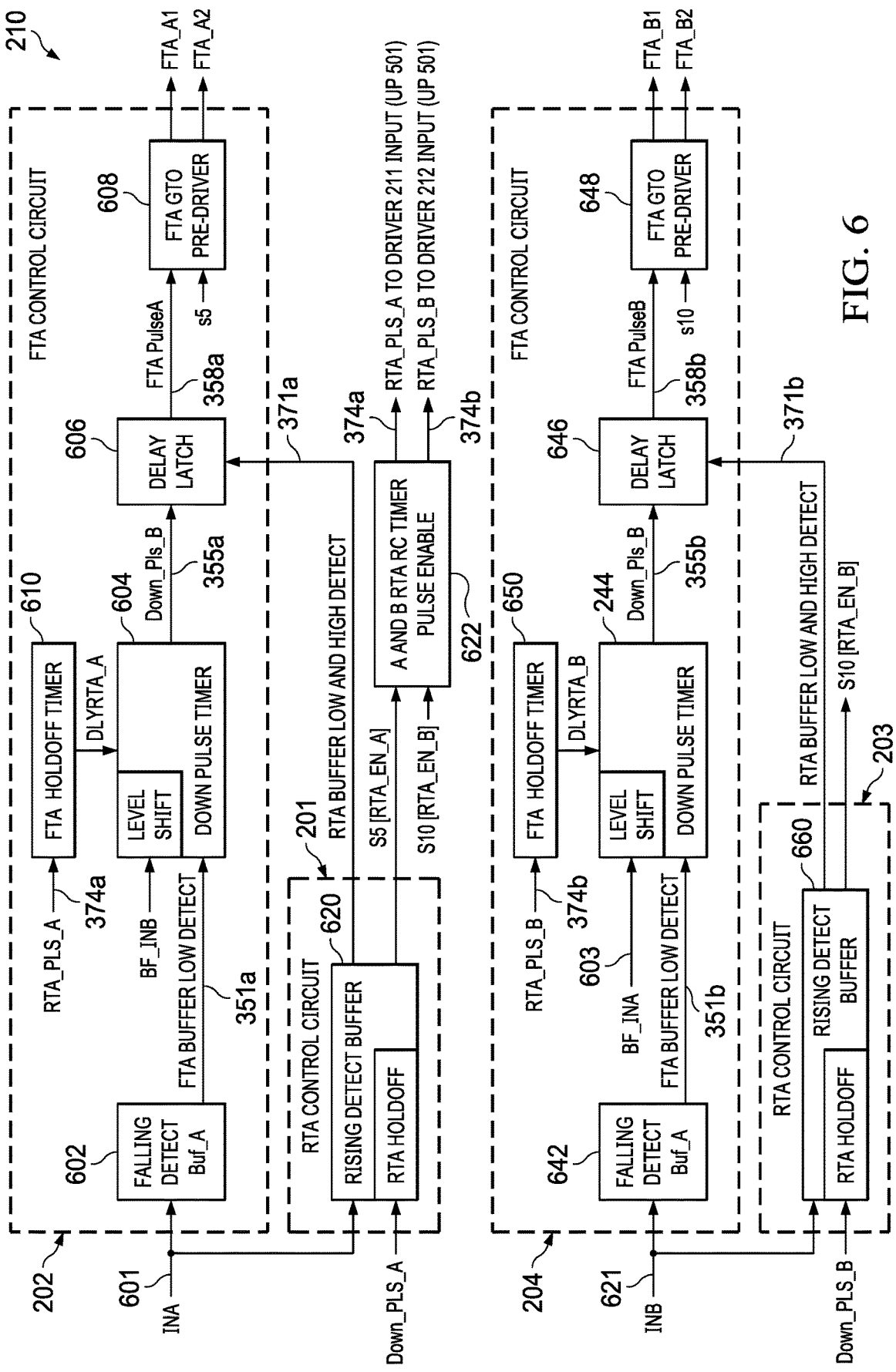
FIG. 6 is a block diagram of a control circuit for controlling the rising and falling edges on the bus in accordance with an example.

FIG. 6 is an example architectural block diagram for implementation of the control circuit 210 of FIG. 2 including the FTA control circuits 202 and 204 and the RTA control circuits 201 and 203. FTA control circuit 202 includes a falling edge detector 602, a down pulse timer 604, a delay latch 606, an FTA GTO pre-driver 608, and an FTA holdoff timer 610. FTA control circuit 204 is similarly implemented and includes a falling edge detector 642, a down pulse timer 644, a delay latch 646, an FTA GTO pre-driver 648, and an FTA holdoff timer 650. The RTA control circuit 201 includes a rising edge detector 620, and the RTA control circuit 203 includes a rising edge detector 660.

With respect to the FTA control circuit 202, the falling edge detector 602 detects a falling edge of the voltage on the A side of the bus (SCL_A or SDA_A). The input signal to falling edge detector 602 is labeled INA 601, and INA 601 may be either SCL_A or SDA_A. The falling edge detector 602 is configured for a threshold detection voltage of the VIH voltage noted above. Upon the falling edge detector 602 detecting the bus voltage has fallen to the threshold detection voltage, the falling edge detector 602 asserts (logic high) the output signal FTA Buffer Low Detect signal 351 (labeled as 351a for the FTA control circuit 202, and 351b for the FTA control circuit 204). An asserted FTA Buffer Low Detect signal 351a (e.g., logic high between edges 352 and 353 in FIG. 3) is an indication that a falling edge on the A side of the bus has been detected, and the FTA Buffer Low Detect signal 351a remains asserted until completion of a subsequent rising edge as explained above and shown in FIG. 3.

The FTA Buffer Low Detect signal 351a is provided to the down pulse timer 604. In response to the asserted FTA Buffer Low Detect signal 351a, the down pulse timer 604 generates the pulse 357 (FIG. 3) on the Down_Pls signal 355 (Down_Pls_A 355a for the FTA control circuit 202, and Down_Pls_B 355b for the FTA control circuit 204) and provides the asserted pulse 357 to the delay latch 606. The delay latch 606 generates the delayed version of the Down_Pls signal pulse 395 and generates the FTA PulseA signal pulse 358 if the three conditions listed above are concurrently present—logic high levels for the FTA PulseA signal pulse 358, the delayed FTA PulseA signal pulse, and RTA Buffer Low and High Detect signal 371 (labeled as 371a for the RTA control circuit 201, and 371b for the RTA control circuit 203). The rising edge detect buffer 620 asserts the RTA Buffer Low and High Detect signal 371a from a logic high to a logic low level upon the bus voltage falling below the falling edge lower threshold voltage (e.g., 325 in FIG. 3). The rising edge detect buffer 620 causes the RTA Buffer Low and High Detect signal 371a to transition from low to high responsive to the bus voltage reaching the VIH threshold 329. The delay latch 606 thus asserts the FTA PulseA signal 355a (pulse 358) to initiate the falling edge acceleration process while implementing GTO-ON and GTO-OFF. The FTA GTO pre-driver 608 includes RC timers and other circuitry that implements GTO-ON and GTO-OFF for falling edge acceleration.

The Down_Pls_A signal 355a is also provided to the rising edge detect buffer 620 and precludes the rising edge detect buffer 620 from activating driver 211 to force the bus high if a rising edge were detected while the Down_Pls_A signal is asserted. If, however, the Down_Pls_A signal 355a is not asserted (a falling edge has not been detected), then the rising edge detect buffer 620 will be configured to detect a rising edge. As a rising edge detection circuit, the rising edge detect buffer 620 detects when the bus voltage reaches the rising edge threshold 329 (FIG. 3) and responds by asserting RTA_EN_A to the A&B RTA Timer Pulse Enable circuit 622.

The A&B Timer Pulse Enable circuit 622 responds to an asserted RTA_EN_A by asserting RTA_Pls_A signal 374a and RTA_Pls_B signal 374b to drivers 211 and 212, respectively. By asserting the RTA_Pls_A (and B) signals 374a and 374b to both drivers 211 and 212, the rising edge is forced to be accelerated on the bus on both sides of the pass-gate transistor Q1, Q2. The RTA_Pls_A signal 374a and the RTA_Pls_B signal are provided to their respective FTA holdoff timers 610 and 650. Each FTA holdoff timer 610, 650 triggers an FTA turn-on hold-off upon detection of a rising edge on the respective RTA_Pls signal 374a, 374b. The FTA turn-on hold-off lasts for a period of time implemented by the respective FTA holdoff timer 610, 650.

Figure 7:
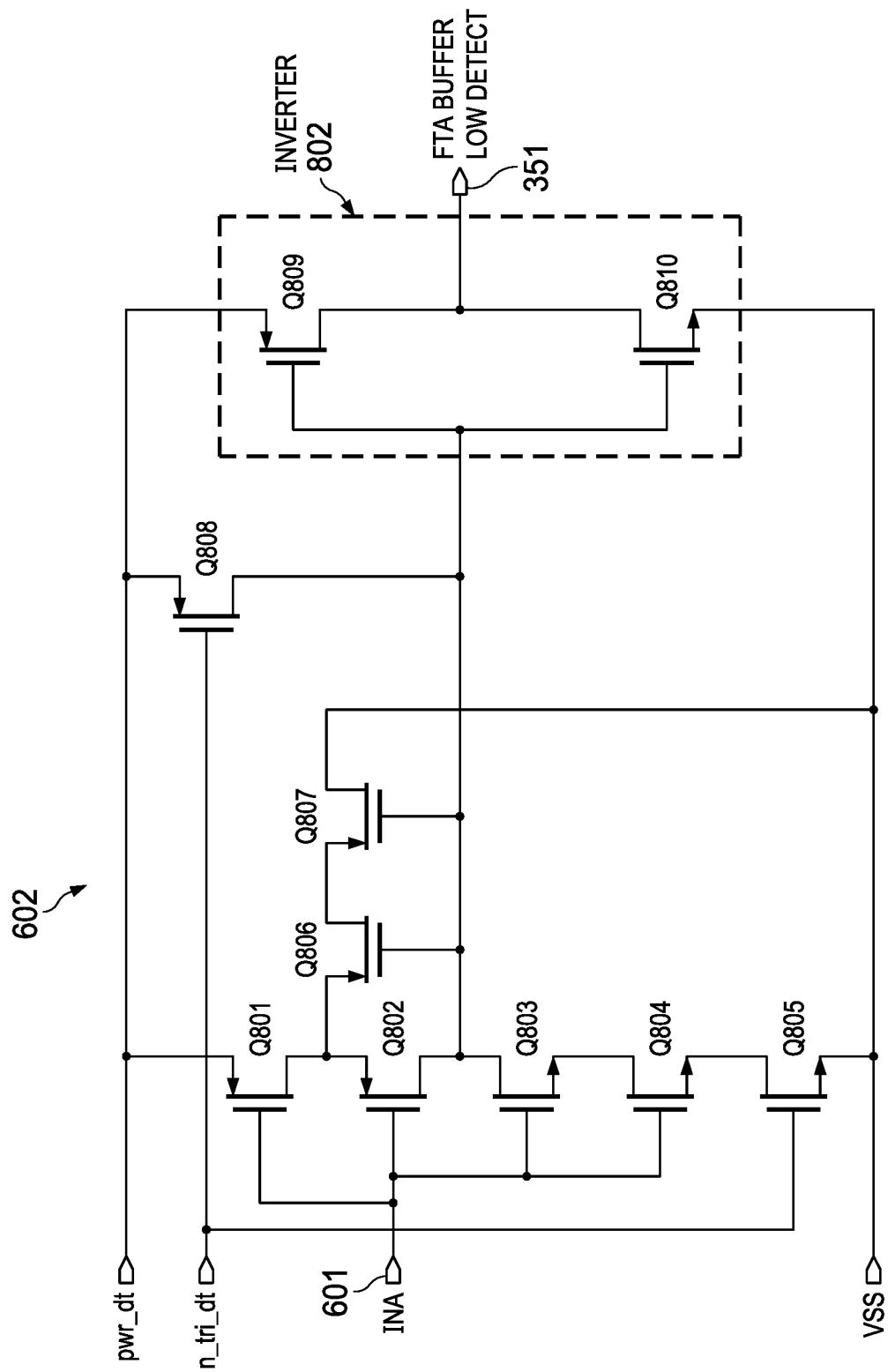
FIG. 7 is a circuit schematic of a falling detect buffer of the control circuit in accordance with an example.

FIG. 7 is an example circuit that can be used to implement falling edge detector 602 and/or falling edge detector 642. The falling edge detector 602, in this example, includes transistors Q801, Q802, Q803, Q804, Q805, Q806, Q807, Q808, Q809, and Q810. Transistors Q801, Q802 and Q806-Q809 are PMOS transistors and transistors Q803-Q805 and Q810 are NMOS transistors. Transistors Q809 and Q810 are configured as an inverter 802 to logically invert the signal on node 803 to produce the output signal FTA Buffer Low Detect 351.

Figure 8:
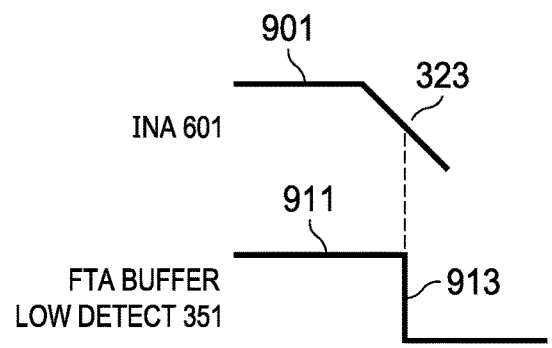
FIG. 8 is a timing diagram illustrating the operation of an aspect of the falling detect buffer of FIG. 7.

Transistors Q801-Q805 are serially-connected between the power rail, PWR_DT, and ground, VSS. The input signal INA is coupled to the gates of transistors Q801-Q805. Responsive to INA being at a high logic level (e.g., greater than the threshold voltage of NMOS transistors Q803-Q805), transistors Q803-Q805 are turned on thereby forcing the voltage on node 803 (which couples the drains of transistors Q802 and Q803 together) to close to VSS (logic low). The inverter 802 logically inverts the logic low on node 803 to a logic high signal as FTA Buffer Low Detect 351. FIG. 8 is a timing diagram illustrating the response of output signal FTA Buffer Low Detect 351 to input signal INA 601. While INA 601 is logic high (as shown at 901), FTA Buffer Low Detect 351 also is high.

Figure 9:
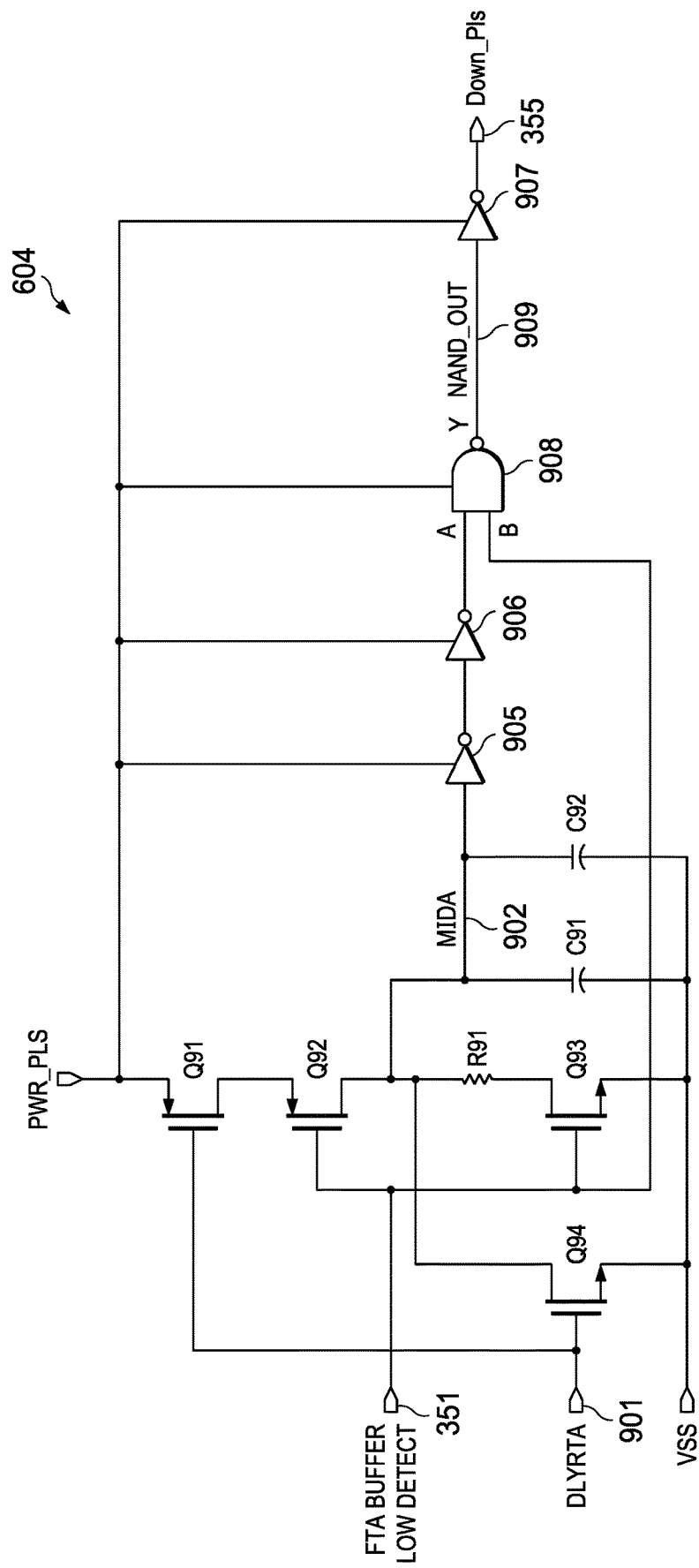
FIG. 9 is a circuit schematic of a down pulse timer in of the control circuit of FIG. 6 in accordance with an example.

During a falling edge in which the voltage of INA 601 decreases, the INA voltage will eventually drop to a threshold voltage (e.g., VIH) that is set by the sizing ratios between PMOS transistors Q806 and Q807 and NMOS transistors Q803-Q805. At that point (point 323 in FIG. 3), transistors Q801 and Q802 turn on and transistors Q803-Q805 turn off. With transistors Q801 and Q802 being on, the voltage on node 803 is pulsed high (to close to the positive power rail PWR_DT). The inverter 802 logically inverts the high signal level on node 802 to a low level as shown in FIG. 9 thereby producing a falling edge 913. When INA is transitioning logic low to high, the series path through transistors Q807 and Q806 is initially off, making the input trip point higher than when the series of path of transistors Q807 and Q806 is on. After INA reaches a high enough voltage (high trip point), the series path of transistors Q807 and Q806 is turned on. For the next falling INA transition, transistors Q807 and Q806 are initially turned on, and the input trip point is now lower than it was when transistors Q807 and Q806 were turned off. After INA reaches a low enough voltage (low trip point), the series path Q807/806 is turned off, and the hysteresis cycle repeats.

FIG. 9 shows an example circuit implementation of the down pulse timer 604, and/or the same circuit implementation can be used for the down pulse timer 644. In this example, the down pulse timer 604 includes PMOS transistors Q91 and Q92; NMOS transistors Q93 and Q94; resistor R91; capacitors C91 and C92; inverters 905, 906, and 907; and NAND gate 908. PMOS transistors Q91 and Q92 are coupled in series between a power rail (PWR_PLS) and resistor R91. The connection node between the drain of transistor Q92 and resistor R91 is labeled the MID node 902. NMOS transistor Q93 is coupled between resistor R91 and ground (VSS). The input signal (FTA Buffer Low Detect 351) drives the gates of transistors Q92 and Q93 and also is provided to the B input of NAND gate 908. INA 601 drives the gates of transistors Q91 and Q94 and is an enable/disable signal for the down pulse timer 604. When INA 601 is low, transistor Q94 is off, transistor Q91 is on and the timer function of the down pulse timer 604 is enabled. When INA 601 is high (901), transistor Q94 is on, transistor Q91 is off and the timer function of the down pulse timer 604 is disabled.

The input to inverter 905 is coupled to the MID node 902, and the output of inverter 905 is coupled to the input of inverter 906. The output of inverter 906 is coupled to the A input of NAND gate 908. The output of NAND gate 908 is coupled to the input of inverter 907, and the output signal Down_Pls 355 is provided by the output of inverter 907.

Capacitors C91 and C92 are coupled in parallel between the MID node 902 and ground VSS. In other embodiments, a single capacitor can be provided between MID 902 and ground instead of multiple capacitors in parallel.

Figure 10:
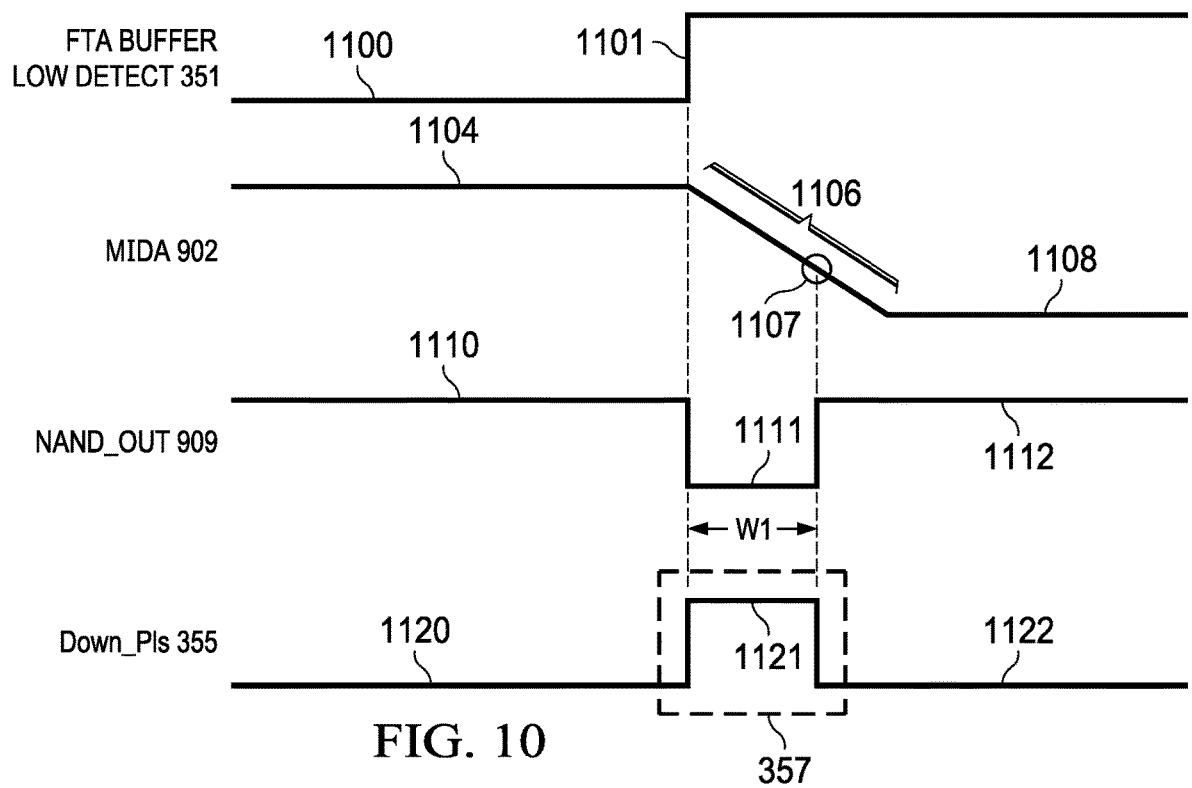
FIG. 10 is a timing diagram illustrating the operation of an aspect of the down pulse timer of FIG. 9.

FIG. 10 is an example timing diagram illustrating the operation of the down pulse timer (such as timer 604 and/or 644). Referring to FIGS. 9 and 10, in the steady state with the FTA Buffer Low Detect signal 351 being low (1100), transistors Q91 and Q92 are on (Q91 is on because the enable signal TRIDLY 901 is low and Q92 is on because FTA Buffer Low Detect is low). With transistors Q91 and Q92 being on, the voltage on MID 902 is pulled high as identified at 1104. With the voltage on MID 902 being high, capacitors C91 and C92 are charged; the output of inverter 905 is low (0); and, thus, the output of inverter 906 is high (1). The A and B inputs of NAND gate 908 are 1 and 0, respectively, thus the output (NAND_OUT 909) of NAND gate 908 is logic high (1) (as identified at 1110) and the Down_Pls signal 355 is logic low (0) (as identified at 1120).

A rising edge 1101 is shown in FIG. 10 for the input FTA Buffer Low Detect signal 351. Responsive to the voltage level of FTA Buffer Low Detect now being logic high, transistor Q93 turns on and transistor Q92 turns off. With transistor Q93 on, capacitors C91 and C92 are discharged through resistor R91 and transistor Q93 to ground. The resistance of resistor R91 and the equivalent capacitance of the parallel combination of capacitors C91 and C92 (e.g., the sum of their individual capacitances) represents an "RC" time constant and the voltage on MID node 902 decreases generally linearly as identified at 1106. Voltage level 1107 represents the maximum voltage level that inverter 905 will recognize as a low. While the MID node voltage is falling once the rising edge occurs of the FTA Buffer Low Detect signal 351, the inverter 905 continues to recognize its input voltage as a logic high, at least until voltage level 1107 is reached. Before the MID node voltage reaches voltage level 1107, the output signal level of inverters 905 and 906 remain unchanged and thus the A input of NAND gate 908 remains a logic 1. However, the rising edge 1101 results in the B input of NAND gate 908 becoming a logic 1, and thus NAND_OUT 909 becomes logic low as identified at 1111. Down_Pls 355 is the logical inverse of NAND_OUT 909 and thus Down_Pls 355 becomes logic high (1121) initiating the beginning of the signal pulse 357 for the Down_Pls signal 355 described above.

When MID 902 falls to voltage level 1107 (the low threshold for inverter 905), the outputs of inverters 905 and 906 change state and thus the A input of NAND gate 908 becomes a logic 0. At that point, the A and B inputs of the NAND gate 908 are 0 and 1, respectively, and thus NAND_OUT 909 is forced to logic 1 (1112) and the Down_Pls signal 355 becomes logic 0 (1122), thereby completing the signal pulse 357. The width W1 of signal pulse 357 is thus a function of the RC time constant implemented by resistor R91 and the parallel combination of capacitors C91 and C92.

Figure 11:
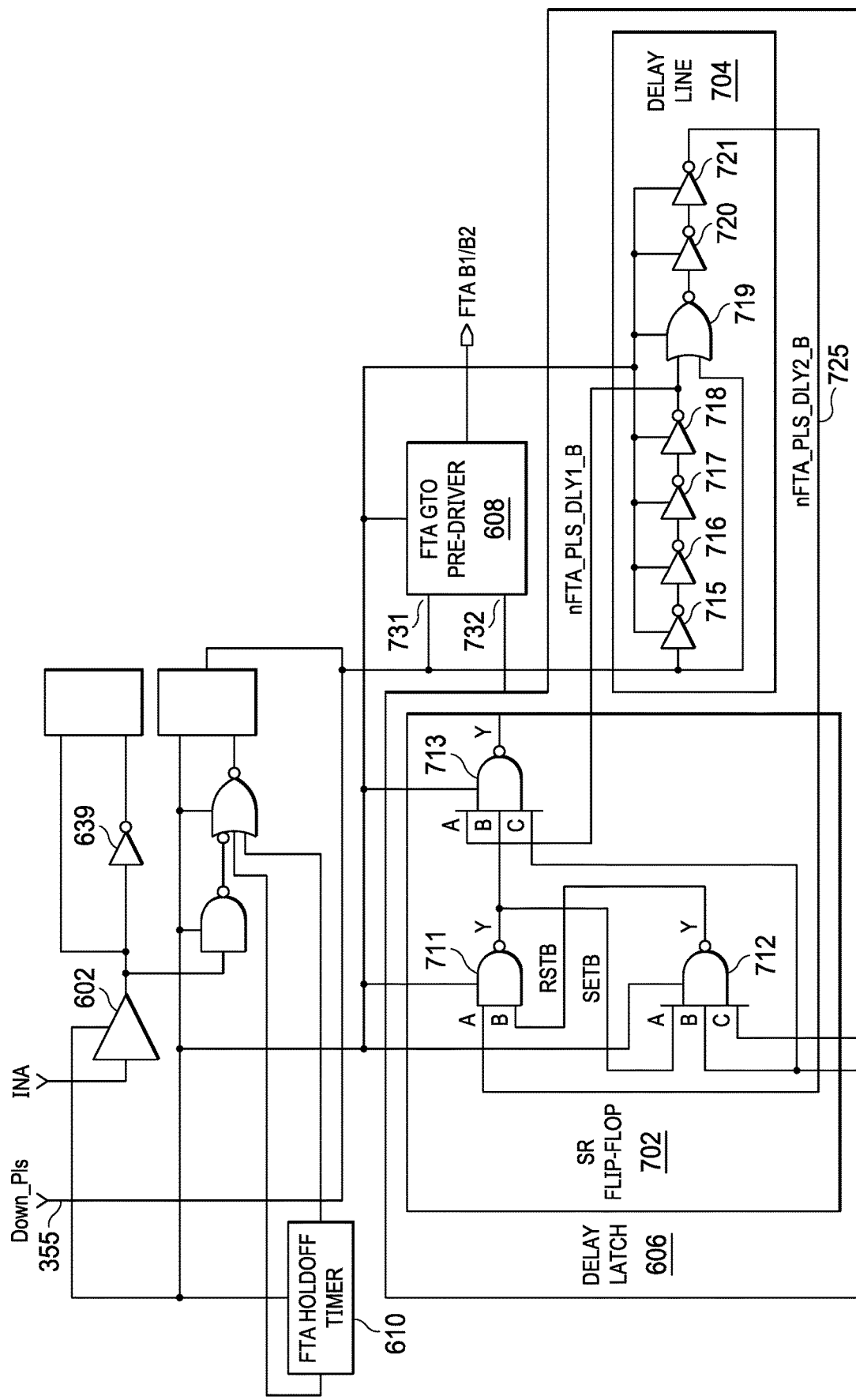
FIG. 11 is a schematic of additional circuitry of the control circuit of FIG. 6.

FIG. 11 illustrates an example implementation of the delay latch 606 (and/or 646). The delay latch 606 in this example includes an SR flip-flop 702 and a delay line 704. The SR flip-flop 702 includes NAND gates 711, 712, and 713. The delay line 704 includes a serial string of inverters 715, 718, and 712; buffers 716, 717 and 720; and a NOR gate 719. The input to delay line 704 is the input to the left-most inverter 715. The input signal to the delay line 704 (input to inverter 715) is the Down_Pls signal 355. The output of the delay line 704 is the output of the right-most inverter 721 and is a delayed version of the Down_Pls signal 355—a signal labeled as nFTA_PLS_DLY2_B 799.

NAND gate 711 has inputs A and B and an output Y. NAND gate 712 as inputs A, B, and C, and an output Y. Input A of NAND gate 711 is coupled to the output of the delay line 704 and thus receives the signal nFTA_PLS_DLY2_B 799. The NAND gates 711 and 712 are cross-coupled and thus the Y output of NAND gate 712 is coupled to the B input of NAND gate 711 (which carries the rest signal RSTB). The Y output of NAND gate 711 is coupled to the A input of NAND gate 712 (which carries the set signal SETB). The B input to NAND gate 712 is the delayed version of the powergood signal (active high) and functions as an overall preset (active low) of the SR flip-flop 702.

NAND gate 713 includes A, B, and C inputs and a Y output. The delay line 704 is center-tapped at the output of inverter 718, meaning that inverter 718 provides a signal that is called nFTA_PLS_DLY1_B that is a delayed version of Down_Pls 355 but not as delayed as nFTA_PLS_DLY2_B. The A input of NAND gate 713 receives nFTA_PLS_DLY1_B signal. The B input of NAND gate 713 is coupled to the output of NAND gate 711. The output of NAND gate 713 is asserted low responsive to all three input signals on its A, B, and C inputs being logic high.

A non-inverting input 731 to the FTA GTO pre-driver 608 receives the Down_Pls_B signal 355 and an inverting input 732 is connected to the output of NAND gate 713. A logic low from the output of NAND gate 713 causes the FTA GTO pre-driver 608 to be enabled and to start the FTA pulse. The FTA GTO pre-driver 608 generates signals FTA_B1 and FTA_B2.

Figure 12:
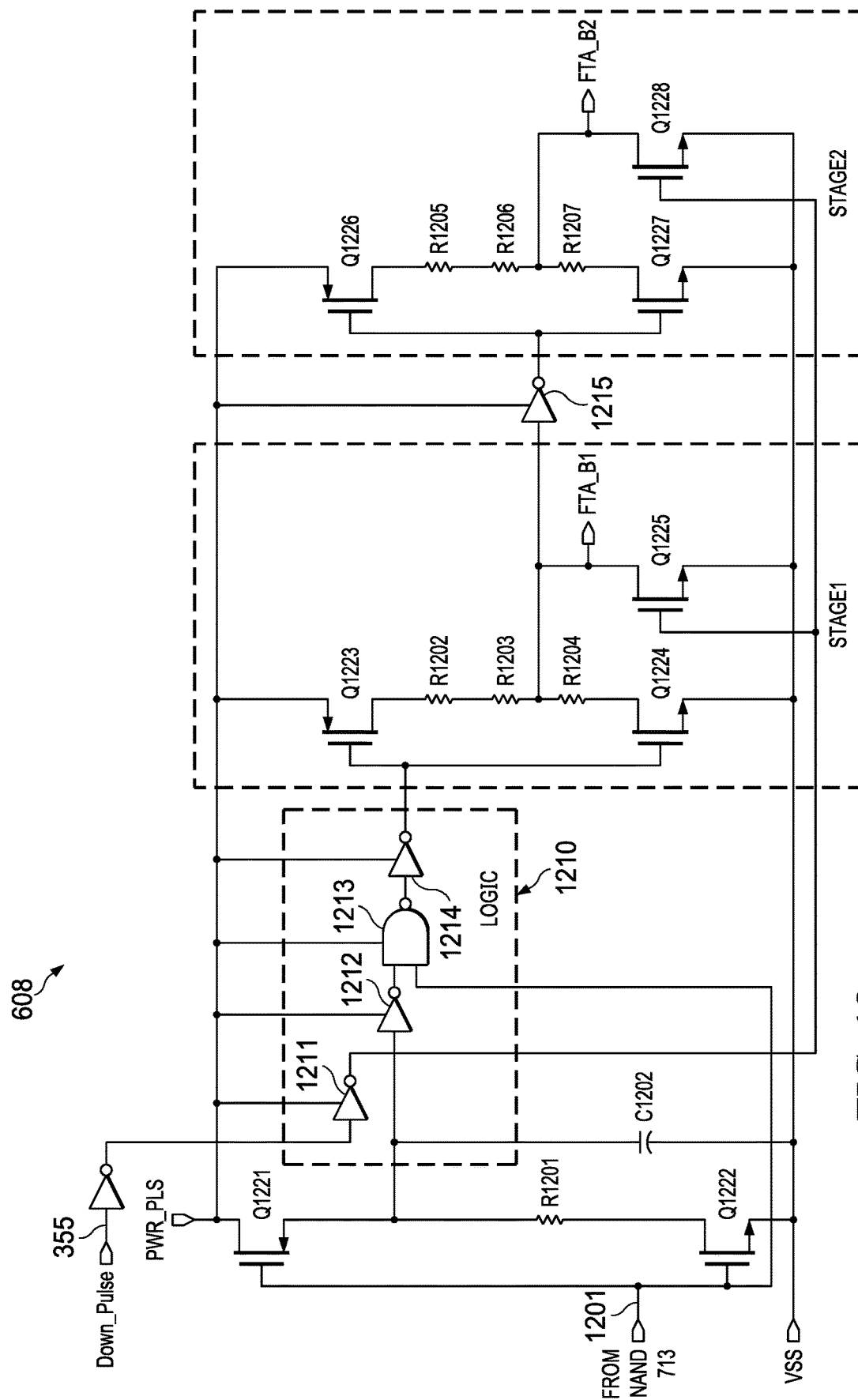
FIG. 12 is a circuit schematic of a falling edge accelerator pre-driver within the control circuit of FIG. 6 in accordance with an example.

FIG. 12 is an example circuit for implementing the FTA GTO pre-driver 608 (and/or FTA GTO pre-driver 648). In this example, the FTA GTO pre-driver 608 includes, among other components, an input 1201; resistor R1201; capacitor C1202; logic 1210; stages STAGE1 and STAGE2; and transistors Q1221 and Q1222. Input 1201 is coupled to the output of NAND gate 713 (FIG. 11). STAGE1 includes the series combination of resistors R1202, R1203, and R1204; and transistors Q1223, Q1224, and Q1225. STAGE2 includes transistors Q1226, Q1227, and Q1228; and resistors R1205, R1206, and R1207. Logic 1210 includes inverters 1211, 1212, and 1214; and NAND gate 1213. The input signal to inverter 1211 is Down_Pulse 355. As explained above, when Down_Pulse 355 is logic high, the FTA can initiate a falling edge acceleration, and when Down_Pulse 355 is logic low, a falling edge acceleration cannot occur. The output of inverter 1211 is the logical inverse of Down_Pulse 355 and controls the on and off state of transistor Q1225.

The output signal from the output of NAND gate 713 is an active low signal meaning that a logic low assertion of the output of NAND gate 713 triggers a falling edge acceleration. FTA GTO pre-driver 608 includes GTO-ON and GTO-OFF capability. Upon the input 1201 receiving a logic low signal from NAND gate 713, transistor Q1221 turns on, and current begins to flow through transistor Q1221 to begin to charge capacitor C1202. As the voltage on capacitor C1202 begins to increase, eventually the voltage exceeds the threshold of inverter 1212. The output of inverter 1212 becomes logic low, and thus both inputs of NAND gate 1213 are logic low, which forces its output to be logic high, and the output inverter 1214 to be logic low. With the output of inverter 1214 being logic low, transistor Q1223 turns on and current flows through transistor Q1223, resistors R1202 and R1203 to output FTA_B1, which controls transistor Q47 (FIG. 4) as explained above. Due to the combination of the resistance of the series combination of R1202 and R1203 and the capacitance of transistor Q47 (e.g., the gate-to-source capacitance and the drain-to-source capacitance), the voltage of the gate signal to transistor Q47 (FTA_B1) rises gradually to effectuate a GTO-ON for the falling time acceleration. Once the voltage of FTA_B1 rises enough to exceed the threshold of inverter 1215, the output of inverter 1215 becomes logic low thereby turning on transistor Q1226. Stage STAGE2 thus turns on and current flows through transistor Q1226, resistors R1205 and R1206 to the gate of transistor Q48 as signal FTA_B2. Similarly, transistor Q48 gradually turns on due to the combined resistance of R1205 and R1206 and the capacitance of transistor Q48.

The FTA GTO pre-driver 608 also provides a GTO-OFF response when Down_Pulse 355 becomes logic high. When Down_Pulse 355 becomes logic high, transistor Q1222 turns on and a current path is thus created for capacitor C1202 to discharge (through resistor R1201 and transistor Q1222). Once capacitor C1202 discharges enough for its voltage to drop below the low voltage threshold of inverter 1212, both inputs of NAND gate 1213 are then logic high, and the output of NAND gate 1213 is logic low. The output of inverter 1214 then becomes logic high thereby turning on transistor Q1224 within STAGE1 gradually pulling FTA_B1 low as the internal capacitance of transistor Q47 discharges through resistor R1224. STAGE 2 has a similar response with the gate of transistor Q48 discharging through resistor R1207. The second stage STAGE2 is then activated to gradually turn on Q48 as described above.

Figure 13:
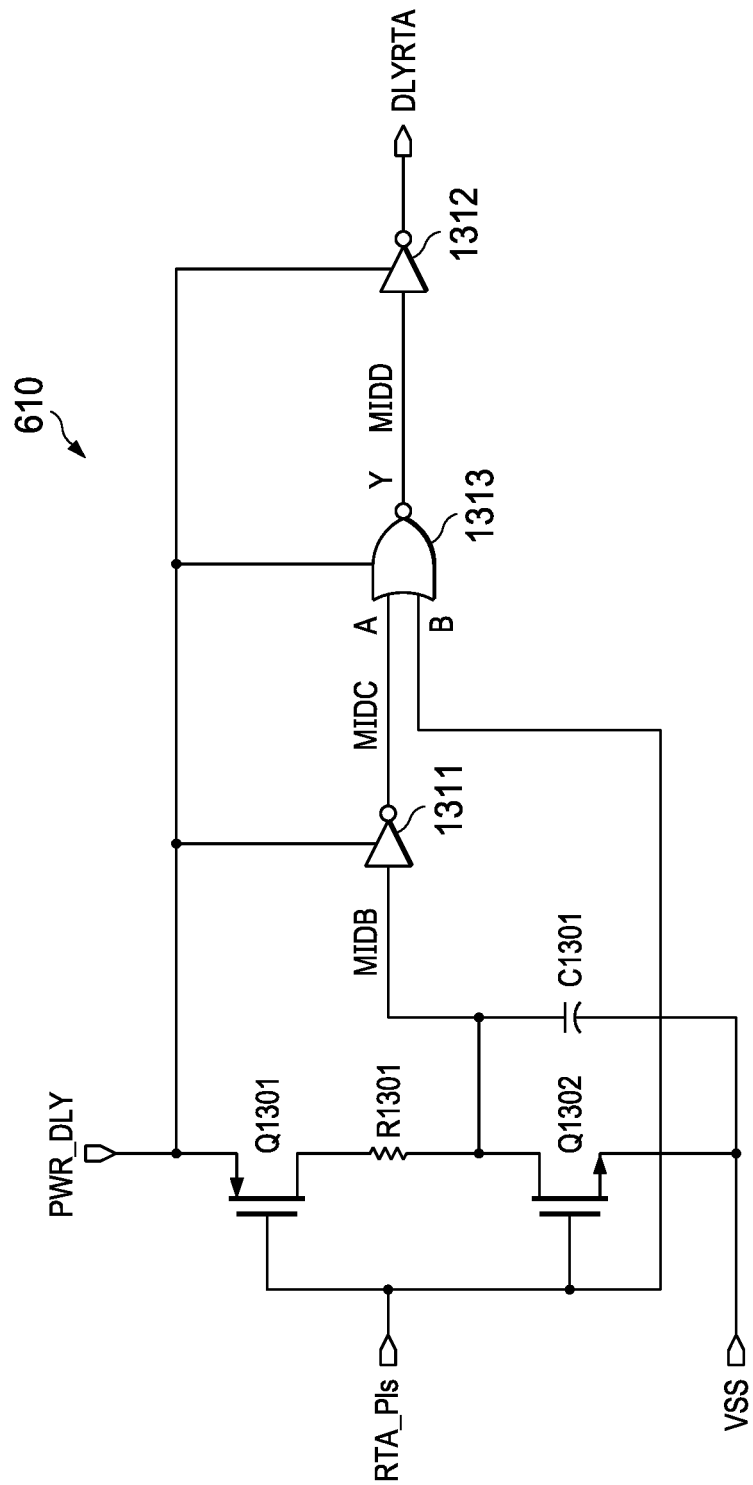
FIG. 13 is a circuit schematic of a hold off timer within the control circuit of FIG. 6 in accordance with an example.

FIG. 13 is an example circuit for implementing the FTA holdoff timer 610 (and/or FTA holdoff timer 650). The function performed by the FTA holdoff timer 610 is to generate an output pulse, DLYRTA responsive to an input pulse, RTA_Pls (also shown as RTA_PLS). As explained below, RTA_Pls is a signal that is generated to turn on the drivers 211 and 212 to accelerate a rising edge upon a rising edge being detected. The output signal, DLYRTA, is provided as an input signal to down pulse timer 604 (and/or down pulse timer 644). The function performed by the FTA holdoff timer 610 is to stretch out the input pulse RTA_Pls to create a slightly longer pulse during which the down pulse timer 604 is prevented from enabling the pull-down transistors Q21, Q22 thereby providing crowbar current mitigation.

In this example, the FTA holdoff timer 610 includes PMOS transistor Q1301, NMOS transistor Q1302, resistor R1301, capacitor C1301, inverters 1311 and 132, and NOR gate 1313. The input signal RTA_Pls (RTA_PLS_A for timer 610 and RTA_PLS_B for timer 650) drives the gates of transistors Q1301 and Q1302. Resistor R1301 is coupled between the drains of transistors Q1301 and Q1302. The source of transistor Q1301 is coupled to the power rail, PWR_DLY, and the source of transistor Q1302 is coupled to ground VSS. The node between resistor R1301 and transistor Q1302 is labeled MIDB and is coupled to the input of inverter 1311. The output of inverter 1311 is coupled to the A input of NOR gate 1313, and the input signal RTA_Pls is coupled to the B input of NOR gate 1313. The output of NOR gate 1313 is coupled to the input of inverter 1312, and the output of inverter 1312 provides the output signal DLYRTA (DLYRTA_A for timer 610 and DLYRTA_B for timer 650).

Figure 14:
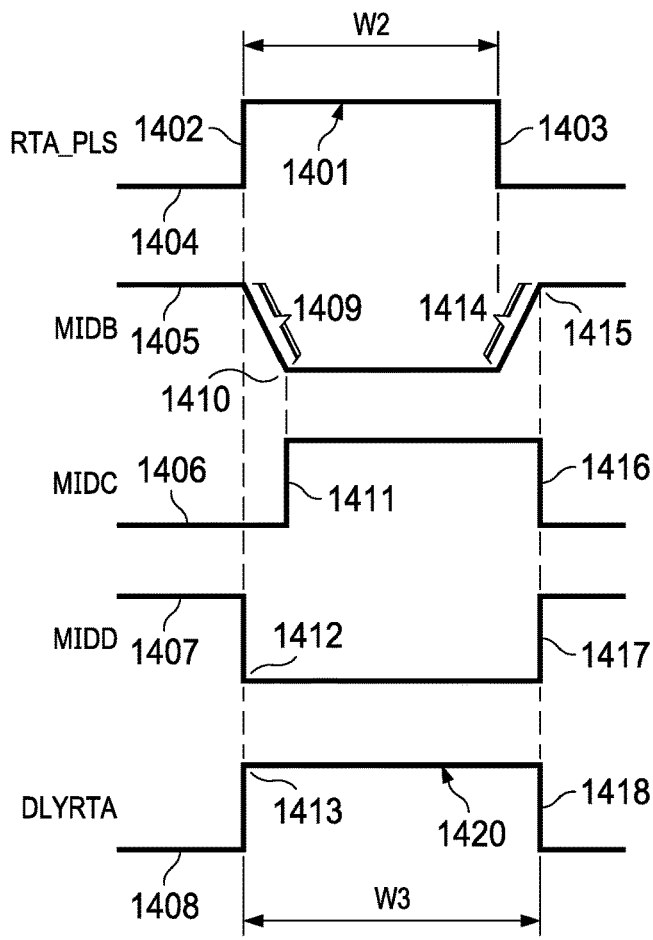
FIG. 14 is a timing diagram illustrating the operation of the hold-off timer of FIG. 13.

FIG. 14 is a timing diagram illustrating the operation of the FTA holdoff timer 610 of FIG. 13. The signals shown in FIG. 14 include RTA_Pls, MIDB, MIDC, MIDD, and DLYRTA. A pulse 1401 is shown for RTA_Pls, and is defined by rising edge 1402 and falling edge 1403. Referring to both FIGS. 13 and 14, when RTA_Pls is low (1404), PMOS transistor Q1301 is on and, at steady state, the voltage of MIDB is at, or close to, PWR_DLY (logic high) as illustrated at 1405. With MIDB being logic high, capacitor C1301 is charged. Further, with MIDB being logic high, MIDC (which is the output of inverter 1311) is logic low (1406). At this point, the A and B inputs of NOR gate 1313 are both logic low, and thus the output of the NOR gate, MIDD, is logic high (1407). Since MIDD is at a logic high level, DLTRTA will be at a logic low level (1408), due to inverter 1312.

At the moment that the rising edge 1402 of RTA_Pls occurs, the voltage of RTA_Pls is large enough to turn on transistor Q1302 and turn off transistor Q1301. The B input of NOR gate 1313 is now logic high due to RTA_Pls being logic high. With transistor Q1302 now being on, capacitor C1301 discharges through transistor Q1302 to ground. The on-resistance of transistor Q1302 in combination with the capacitance of capacitor C1301 causes MIDB to decay at an approximately linear rate as shown at 1409 in FIG. 14. Voltage 1410 represents the voltage level which the inverter 1311 recognizes as a logic low and thereby causes the output signal of inverter 1311 (MIDC) to change from low to high as indicated by rising edge 1411. Thus, rising edge 1411 of MIDC occurs at a time point after the rising edge 1402 of RTA_Pls. The time delay between edges 1402 and 1411 is proportional to the RC time constant of the on-resistance of transistor Q1302 and the capacitance of capacitor C1301.

Upon RTA_Pls becoming logic high at the occurrence of rising edge 1402, the B input of NOR gate 1313 becomes logic high. Until MIDB falls to voltage threshold 1410, the A input of nor gate 1313 remains at logic low, and thus the NOR gate forces its output (MIDD) to logic low (1412), and thus DLRYTA becomes logic high (1413). Even when MIDB eventually falls below voltage threshold 1410 to be considered as a logic low to the input of inverter 1311, because the B input of NOR gate 1313 is logic high due to the high level during pulse 1401 of RTA_Pls, the output of NOR gate 1313 (MIDD) remains logic low, and thus DLYRTA remains logic high.

Upon the occurrence of falling edge 1403, transistor Q1301 turns on and transistor Q1302 turns off. With transistor Q1301 being on, current flows through transistor Q1301 to capacitor C1301 to thereby charge up capacitor C1301 as indicated at 1414. The slope of ramp 1414 is a function of the RC time constant implemented by the resistance of resistor R1301 and the capacitance of capacitor C1301. The absolute values of the slopes of downward ramp 1409 and upward ramp 1414 may be the same or different. In one embodiment, the resistance of resistor R1301 is larger than the on-resistance of transistor Q1301 and thus the absolute value of the slope of the upward ramp 1414 is smaller than the absolute value of the slope of the downward ramp 1409.

Voltage threshold 1415 represents the threshold which the inverter 1311 recognizes as a logic high. During ramp 1414 and until threshold voltage 1415 is reached, MIDC remains logic high, MIDD remains logic low, and DLYRTA remains logic high. Once MIDB reaches voltage threshold 1415, the signals MIDC, MIDD, and DLYRTA change states at edges 1416, 1417, and 1418, respectively.

The rising edge 1413 and falling edge 1418 of DLYRTA defines a pulse 1420 having a width W3. The width W3 of the DLYRTA pulse 1420 is larger than the width W2 of the RTA Pls 1401. During pulse 1420 of DLRTA, the FTA down pulse time 604 is precluded from asserting the Down_Pls signal 355 to initiate turning on the pull-down transistors.

Figure 15:
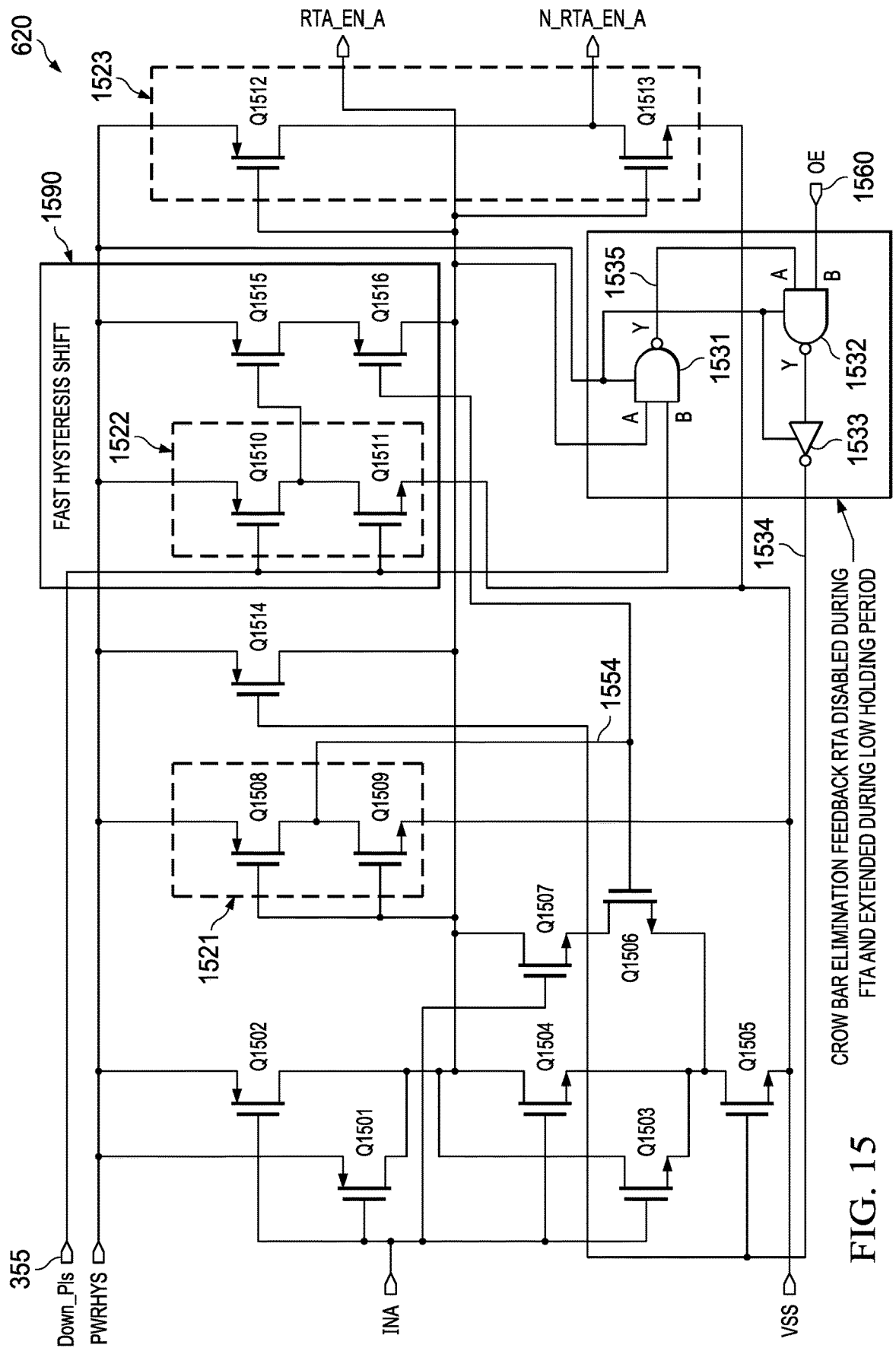
FIG. 15 is a circuit schematic of a rising detect buffer within the control circuit of FIG. 6.

FIG. 15 is an example implementation of the rising edge detector 620 (and/or rising edge detector 660). As described above, the rising edge detector 620 is a dual-use edge detector. Although the circuit of FIG. 15 is called a "rising edge" detector, the rising edge detector detects (a) a rising edge (when not otherwise held off by a recently detected falling edge), and (b) that a falling edge has fallen below a lower threshold.

The example rising edge detector 620 includes transistors Q1501-Q1516; NAND gates 1531 and 1532; and inverter 1533. PMOS transistor Q1508 and NMOS transistor Q1509 are configured as an inverter 1521. Similarly, PMOS transistor Q1510 and NMOS transistor Q1511 are configured as an inverter 1522. PMOS transistor Q1512 and NMOS transistor Q1513 are configured as an inverter 1523. The input signal INA (for detector 620 and INB for detector 660) is coupled to and drives the gates of PMOS transistors Q1501 and Q1502; and NMOS transistors Q1503, Q1504, and Q1507. The sources of transistors Q1501 and Q1502 are coupled to power rail PWRHYS. The sources of transistors Q1503 and Q1504 are coupled together and to the drain of transistor Q1505. The source of transistor Q1505 is coupled to ground VSS.

Transistors Q1501, Q1504, Q1505, and Q1507 are low threshold voltage (LVT) transistors meaning that their threshold voltage (Vt) is lower than that of the other transistors such as Q1502 and Q1503. In one example, the Vt of the LVT transistors Q1501, Q1504, Q1505, and Q1507 is in the range of 350 mv to 500 mv, while the Vt of the higher threshold voltage transistors Q1502 and Q1503 is the range of 650 mV to 800 mV. An LVT transistor turns on with a smaller gate-to-source voltage (Vgs) than a higher threshold voltage transistor. Transistors Q1507 and Q1506 are coupled together and provide hysteretic feedback to the "low side" of the input stage, that is, the combination of transistors Q1503 and Q1504. Inverter 1521 provides digital control for transistor Q1506. Responsive to RTA_EN_A (for detector 610 and RTA_EN_B for detector 660) being logic high, the output signal 1559 from inverter 1521 will be logic low thereby turning off transistor Q1506. Responsive to RTA_EN_A being logic low, however, the output signal 1559 from inverter 1521 will be logic high thereby turning on transistor Q1506. When INA is transitioning from low to high, the series path through transistors Q1507 and Q1506 is initially off, thereby making the input trip point higher than when transistors Q1507 and Q1506 are on. After INA reaches a high enough voltage (high trip point) the series path of transistors Q1507 and Q1506 is turned on. For the next falling INA transition, transistors Q1507 and Q1506 are initially turned on. Accordingly, the input trip point is now lower than it was when transistors Q1507 and Q1506 were off. After INA reaches a low enough voltage (low trip point), the series path of transistors Q1507 and Q1506 is turned off, and the cycle repeats.

As explained above, the power supply voltage for the A or B side of the voltage translator 130 may be any voltage within a fairly wide range (e.g., 1.08V to 3.6V). that being the case. As a hysteric buffer, rising edge detect buffer 620 (and/or rising edge detect buffer 660) will thus need to be capable of detecting a falling edge for a power supply domain as low as 1.08V. For example, it may be desirable for a falling edge to be detected when the bus voltage falls below 0.25*VCC, where VCC may be as low as 1.08V, and thus 0.25*1.08V equals 0.27V, and to detect a rising edge at 0.4*VCC, which equals 0.43V. A conventional transistor's threshold voltage is, for example, 0.7 V, thus such transistor will not be on when its gate-to-source voltage is 0.27V or even 0.43V. Therefore, a standard transistor cannot differentiate between two hysteresis voltages at 0.27V and 0.43V, and thus not be usable to detect a rising or falling edge for a power supply voltage at or approximately equal to 1.08V.

To address this issue, a combination of LVT and standard transistors are used to detect the logic high thresholds for a rising edge and a logic low threshold for the falling edge. At low power supply voltages, standard transistor Q1503 will not be on regardless of the bus voltage (within the limits of the power supply voltage) and LVT transistor Q1504 will be on for a bus voltage greater than its Vt (which may be in the range of 350 mV to 500 mV), and off for a bus voltage below its Vt. However, at higher power supply voltages (e.g., closer to 3.6V), both transistors Q1503 and Q1504 are turned to detect a rising edge. Similarly, LVT transistor Q1501 is used to detect a falling edge for a low value for the power supply voltage, and both transistors Q1501 and Q1502 are used for higher values of the power supply voltage.

The drains of transistors Q1504 and Q1507 are coupled together and to gates of transistors Q1508 and Q1509. The output of inverter 1521 (the drains of transistors Q1508 and Q1509) is the logical inverse of the signal on the drains of transistors Q1504 and Q1507. The output of inverter 1521 (drains of transistors Q1508 and Q1509) is coupled to the gates of transistors Q1506 and Q1516. The input signal to inverter 1522 is the Down_Pls signal 355 (e.g. 355*a* for control circuit 202 and/or 355*b* for control circuit 204). The output from inverter 1522 (which is the logical inverse of Down_Pls signal 355) is coupled to the gate of transistor Q1515. The output signal RTA_EN_A is the signal at the drains of transistors Q1501, Q1504, Q1507, Q1514 and Q1516. The signal RTA_EN_A is also inverted, via inverter 1523, to provide the logical inverse of RTA_EN_A, which is labeled as N_RTA_EN_A in FIG. 15. Inverter 1522 and transistors Q1515 and Q1516 comprise a fast hysteresis shift circuit 1590, whose operation is explained below.

The A input of NAND gate 1531 is the output signal RTA_EN_A and the B input of NAND gate 1531 is Down_Pls 355. The output of NAND gate 1531 is coupled to the A input of NAND gate 1532. The B input of NAND gate 1532 is configured to receive an output enable (OE) signal 1560. The output of NAND gate 1532 is coupled to and inverted by inverter 1533. Thus, the combination of NAND gate 1532 and inverter 1533 is functionally equivalent to an AND gate, and in other embodiments, NAND gate 1532 and inverter 1533 are replaced with an AND gate.

The output signal 1534 from inverter 1533 drives the gates of NMOS transistor Q1505 and PMOS transistor Q1514. When OE 1560 is low, signal 1534 is also low due to the combination of NAND gate 1532 and inverter 1533. With signal 1534 being low, transistor Q1514 is turned on thereby pulling RTA_EN_A to a logic high state. Accordingly, regardless of the logic state of INA, with OE low, RT_EN_A is forced high. Once the power rail PWRHYS reaches a minimally sufficient level (as detected by a "power good" circuit (not shown)), the power good circuit asserts OE 1560 to a logic high state, which turns off transistor Q1514 and turns on transistor Q1505. The rising edge detect buffer 620 of FIG. 15 is able to function as described herein with transistor Q1505 being on and Q1514 being off.

Figure 16:
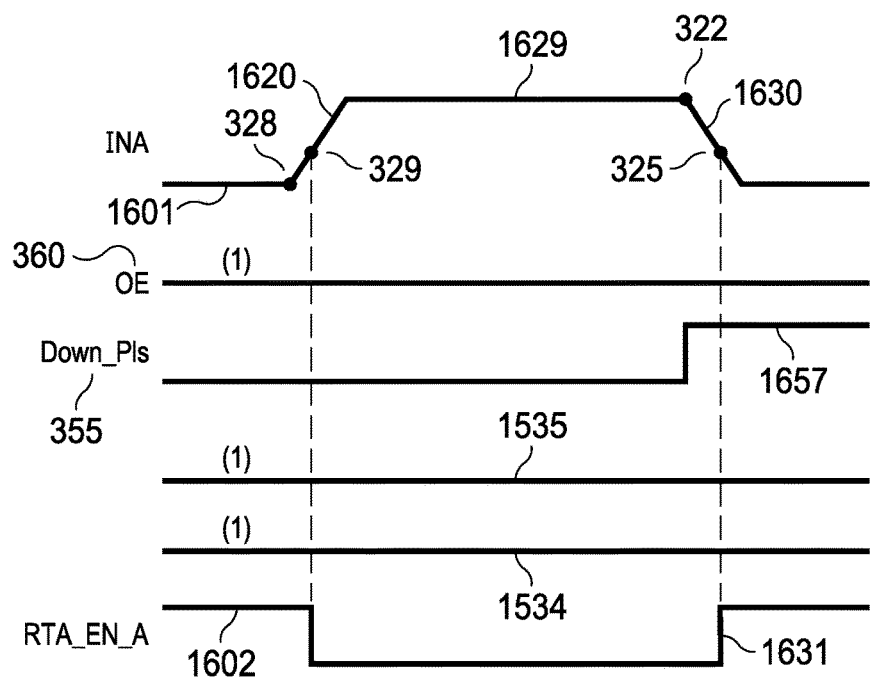
FIG. 16 is a timing diagram illustrating the operation of the rising detect buffer of FIG. 15.

When Down_Pls 355 is low, the rising edge detect buffer 620 is configured to detect a rising edge on the bus, as follows. FIG. 16 is a timing diagram showing an example of a rising edge 1620 of INA signal 601 and other signals within the rising edge detect buffer 620, namely, OE 1560, Down_Pls 355, signals 1535 and 1534, and RTA_EN_A. OE 1560 is logic high as noted above. FIG. 16 also illustrates a falling edge 1630.

Describing the operation of the rising edge detect buffer 620 for the rising edge 1620, with INA at a logic low level (as indicated by reference numeral 1601), PMOS transistors Q1501 and Q1502 are on and thus RTA_EN_A is pulled high (1602). Down_Pls 355 is logic low, which causes the rising edge detect buffer 620 to function as a rising edge detector. A low signal level on Down_Pls 355 is inverted to a logic high level by inverter 1522 which causes PMOS transistor Q1515 to be off thereby disabling operation of the fast hysteresis shift circuit 1590. Further, with Down_Pls 355 being low and RTA_EN_A being high, the output signal 1535 of NAND gate 1531 will be logic high. With both OE 1560 and signal 1535 being logic high, signal 1534 is also logic high, which causes transistor Q1505 to remain on and transistor Q1514 to be off.

At point 328, the external transistor (e.g., Q9) is turned off thereby initiating a rising edge as shown on INA. At point 329, the INA voltage becomes high enough that transistor Q1504 turns on. As explained above, transistor Q1504 has a lower Vt than its counterpart transistor Q1503 (their gates, sources, and drains are connected together so that their terminals experience the same voltages). With transistor Q1504 being on (and Q1505 being on), the voltage on the drain of transistor Q1504 is pulled low and thus RTA_E-NA_A is pulled low. As INA continues to increase, transistor Q1503 (having a higher Vt than transistor Q1504) eventually turns on as well further reinforcing the low signal level for RTA_EN_A. Due to the rising edge of INA, transistors Q1501 and Q1502 also turn off, with Q1502 turning off earlier than Q1501 due to Q1502 having a higher Vt than Q1501.

For the falling edge 1630, Down_Pls 355 is logic high (1657), which, via inverter 1522, turns on transistor Q1515 thereby enabling the fast hysteresis shift circuit 1590. For a falling edge detection function, INA starts at logic high (1629). At point 322, INA starts to decrease. The rising edge detect buffer 620 detects when INA reaches the falling edge lower threshold 325 during this decrease in INA. When the decrease in INA reaches the falling edge lower threshold 325, one or both of transistors Q1501 and Q1502 turn on thereby pulling RTA_EN_A high as indicated at rising edge 1631. A logic high value (1) for RTA_EN_A causes the output signal 1559 of inverter 1521 to become logic low (0). With signal 1559 being logic low, transistor Q1516 is turned on reinforcing RTA_EN_A being pulled up to PWRHYS via transistor Q1515. The series-connected transistors Q1515 and Q1516 are sized ("size" referring to the ratio of their channel width (W) to channel length (L)) relatively high, which causes the INA trip point to be at a higher level than when these transistors are off.

With RTA_EN_A now being logic high, the A input of NAND gate 1531 is logic high. Further, because DOWN_PLS 355 is logic high, the B input of NAND gate 1531 also is logic high, and thus the output signal 1535 of NAND gate 1531 is logic low, which, through NAND gate 1532 and inverter 1533 results in a logic low on signal 1534 to the gate of NMOS transistor Q1505. With the gate of transistor Q1505 being logic low, transistor Q1505 is off thereby preventing the rising edge detect buffer 620 from being able to detect a rising edge (which may otherwise happen in the face of noise on INA) and thus preventing the rising edge detect buffer from being able to assert RTA_EN_A low in response to a rising edge of INA. Accordingly, due to both a fast shift to a larger hysteresis voltage and a digital response to shut off the buffer's ability to detect rising edges, the rising edge detect buffer 620 is unable to respond to a noise-based rising edge on INA while configured to detect a falling edge lower threshold (via Down_Pls 355 being high).

FIG. 17 is a circuit schematic of the NOR gate circuit 280 of FIG. 2. While other NOR gate implementations may be used for NOR gate 280, the NOR gate of FIG. 17 implements a function that is equivalent to a NOR gate. The example NOR gate circuit 280 of FIG. 17 includes transistors M1701-M1705; inverters 1706-1707; and NAND gate 1708. As described above, the RTA control circuit 201 (FIG. 2) asserts control signal 231*a* high in response to the detection of a rising edge on the A bus segment, and the RTA control circuit 203 (FIG. 2) asserts control signal 231*b* high in response to the detection of a rising edge on the B bus segment. Control signal 231*a* is coupled to the gate of transistor M1701 and control signal 231*b* is coupled to the gate of transistor M1702. The drains of transistors M1701 and M1702 are coupled together and provide the active low output signal 281 described above regarding FIG. 2. Transistors M1703 and M1704 are turned on in response to the output signal from NAND gate 1708. NAND gate 1708 asserts its output signal low thereby turning on transistor M1704 when both of its inputs are logic "1".

The signals to the inputs of NAND gate 1708 are inverted versions of the signals to the gates of transistors M1701 and M1702. NAND gate 1708 fully qualifies the detected transition to the on-state of one or the other of transistors M1701 and M1702, because both inputs to the NAND gate 1708 must be high for an acceptable duration to set signal 281 to a logic high level. The condition where both inputs to NAND gate 1708 are a logic high is equivalent to both the I2C A-side and B-side being at low levels as sensed by the "Rising Detect Buffers (both A & B)" of FIG. 6. Signal 281 will not become logic high unless this condition occurs. There are further analog circuit details to how this function works. Once the output s8 of NAND gate 1708 becomes low, transistor M1704 is turned on providing a path to VCC through M1704 and M1703. Transistor M1703 conducts because its gate is driven low by signal s17 as it is receiving a buffered true logic version of signal 281 via inverters 1706 and 1707 and, then held capacitively low for a short transient duration defined after both inputs to the gates of M1701 and M1702 go low turning them off and before the path to VCC through M1303 and M1304 is asserted. The path to VCC through M1703 and M1704 is a low impendence path that quickly drives signal 281 high. Once signal 281 is logically high, as sensed by inverters 1706 and 1707, node s17 transitions high and node s15 transitions low. Signal s17 being high shuts off transistor M1703 disabling the low impedance path while s15 being low enables a much higher impedance driver, transistor M1705, holding signal 281 high. The reason for the switch from low impedance to high impedance drive on the s44 node (signal 281) is to improve the rising edge detection performance of the NOR gate circuit 280 and to mitigate the possibility of glitching. Essentially, when either transistor M1701 or M1702 turns on, that transistor(s) will quickly overcome the contention from transistor M1705 driving high before it is subsequently shut off.

The input to inverter 1706 is the control signal 281. The output of inverter 1706 is coupled to the input of inverter 1707 and also is coupled to the gate of transistor M1705. The output of inverter 1707 is coupled to the gate of transistor M1703. Responsive to either or both of signals 231a or 231b being asserted high, the respective transistor M1701 and M1702 is turned on thereby pulling signal 281 to a logic low level.

FIG. 18 is a circuit schematic of an example implementation of the rising edge pulse timer 282. The rising edge pulse timer 282 generates output pulses (active high) for RTA_Pls_A and RTA_Pls_B to thereby cause the respective drivers 211 and 212 to accelerate the rising edges on the A and B bus segments. The rising edge pulse timer 282 of FIG. 18 includes transistors M1801 and M1803; resistor R1804; capacitor C1805; inverters 1806, 1807, and 1809-1812; NOR gate 1808; and voltage translator 1813. The output signal 281 from NOR gate 280 is coupled to the gates of transistors M1801 and M1803. Transistor M1801 is an NMOS device and transistor M1803 is a PMOS device. Thus, when signal 281 is high, transistor M1801 is on and transistor M1803 is off, and when signal 281 is low, transistor M1803 is on and transistor M1801 is off. The source of transistor M1801 is coupled to ground, and the source of transistor M1803 is coupled to the positive power rail. Resistor R1804 is coupled between the drains of transistors M1801 and M1803. Capacitor C1805 is coupled between resistor R1804 (node 1821) and ground.

When signal 281 is high (deasserted), transistor M1801 is on and thus the voltage on node 1821 is low. Node 1821 provides the input to inverter 1806. Inverter 1807 logically inverts the output signal from inverter 1806. The A input of NOR gate 1808 is coupled to the output of inverter 1807. Signal 281 is coupled to the B input of NOR gate 1808. The output of NOR gate 1808 is logic low when at least one of its inputs is high. When both inputs of NOR gate 1808 are low, the output of NOR gate is high. When signal 281 is at its deasserted level (high), the output of NOR gate 1808 is low. Further, with signal 281 being high, transistor M1801 is on, and node 1821 is pulled low and, through serial inverters 1806 and 1807, the A input of NOR gate 1808 is low.

When a rising edge is detected, signal 281 is forced low as explained above. At this point, both the A and B inputs of NOR gate are low thereby forcing the output of NOR gate high. Through inverters 1809 and 1810, the RTA_Pls_B signal is forced high. The RTA_Pls_A signal also is forced high via the voltage translator 1813 and inverter 1812. The voltage translator 1813 accounts for the fact that the A side of the bus may be at a different supply voltage domain than the B side.

Signal 281 being low, however, causes transistor M1803 to turn on, and current then flows through the resistor R1804 to begin to charge capacitor C1805. The voltage across capacitor C1805 (on node 1821) increases as the capacitor begins to charge. The rate at which the capacitor charges is a function of the RC time constant implemented by the combination of resistor R1804 and capacitor C1805. Eventually, the voltage on node 1821 increases above the trip point of inverter 1806 (the threshold level at which the input of inverter 1806 is considered to be logic high). The output of inverter 1807 also changes from low to high. After a time delay implemented by the RC time constant of resistor R1804 and capacitor C1805, the voltage on the A input of NOR gate 1808 transitions from low to high, thereby forcing RTA_Pls_A and RT_Pls_B to become logic low. Thus, the time duration during which the rising edge is accelerated is controlled by the rising edge pulse timer 282.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While some example embodiments suggest that certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

Modifications are possible in the described embodiments, and other embodiments are possible, within the scope of the claims.

What is claimed is:

1. An integrated circuit (IC), comprising:
   a first terminal;
   a driver having a driver input and a driver output, the driver output coupled to the first terminal;
   a rising time accelerator (RTA) control circuit having an input coupled to the first terminal and having an output, the RTA control circuit configured to detect a rising edge on the first terminal and to assert a control signal at the output of the RTA control circuit to cause the driver to accelerate a change in voltage on the first terminal at a faster rate than the detected rising edge;
   a first transistor coupled between the first terminal and a ground, the first transistor having a control input; and
   a falling time accelerator (FTA) control circuit coupled to the first terminal and to the control input of the first transistor, the FTA control circuit configured to detect a falling edge of a signal on the first terminal and, in response to detecting the falling edge, to generate a control signal for the control input to turn on the first transistor to force the signal to decrease at a faster rate than the detected falling edge, the FTA control circuit also having a hold-off control output coupled to the RTA control circuit to prevent the RTA control circuit from causing the driver to accelerate a rising edge.

2. The IC of claim 1, further including a timer coupled to the output of the RTA control circuit, the timer configured to generate a timed pulse signal to activate the driver to accelerate the signal on the first terminal.

3. The IC of claim 1, in which the FTA control circuit includes:
   a falling edge detector circuit comprising an input transistor stage having a falling edge detector circuit input and a falling edge detector circuit output;
   a hysteretic feedback circuit coupled to the input transistor stage to cause the input transistor stage to selectively have a first threshold or a second threshold, the second threshold being greater than the first threshold;
   wherein the input transistor stage is configured to cause a first signal edge on the falling edge detector circuit output in response to a signal on the first terminal falling below the first threshold; and
   wherein the input transistor stage is configured to cause a second signal edge, opposite the first signal edge, on the falling edge detector circuit output in response to a signal on the first terminal increasing above the second threshold.

4. The IC of claim 1, wherein the FTA control circuit includes a down pulse timer configured to generate a hold-off pulse on the hold-off control output.

5. The IC of claim 1, in which the FTA control circuit is configured to avoid turning on the first transistor even if a falling edge is detected responsive to a voltage on the first terminal being below a threshold upon expiration of a timer.

6. The IC of claim 5, in which the RTA control circuit includes an input transistor stage and a hysteresis shift circuit couple to the input transistor stage, the input transistor stage is configured to detect a signal on the first terminal rising above a first threshold and is configured to detect a signal on the first terminal falling below a second threshold, the first threshold is higher than the second threshold.

7. The IC of claim 6, the RTA control circuit including:
   a control input;
   an RTA control circuit output; and
   a first logic gate having first and second logic gate inputs, the first logic gate input coupled to the RTA control circuit output, and the second logic gate input coupled to the control input, the first logic gate having a first logic gate output.

8. The IC of claim 7, having a second logic including third and fourth logic gate input, the third logic gate input coupled to the first logic gate output, and the fourth logic gate input coupled to an output enable terminal.

9. The IC of claim 1, in which the RTA control circuit is a first RTA control circuit, the FTA control circuit is a first FTA control signal, and the driver is a first driver, the IC including:
a pass-gate transistor having first and second pass-gate terminals, the first pass-gate terminal is coupled to the first terminal of the first transistor;
a second transistor coupled to the second pass-gate terminal;
a second RTA control circuit coupled to the second transistor;
a second FTA control circuit coupled to the second transistor; and
a second driver having a driver input and a driver output, the driver output of the second driver coupled to the second transistor.

10. The IC of claim 9, further including:
a logic circuit coupled to outputs of the first and second RTA control circuits, the logic circuit having an output; and
a timer having an input coupled to the output of the logic circuit, the timer having an output coupled to the driver inputs of the first and second drivers.

11. An integrated circuit (IC), comprising:
a first bus terminal;
a second bus terminal;
a pass-gate transistor coupled between the first and second bus terminals;
a first rising time accelerator (RTA) control circuit coupled to the first bus terminal, the first RTA control circuit configured to detect a rising edge of a first signal on the first bus terminal and, in response, to accelerate a voltage increase of the first signal on the first bus terminal;
a first falling edge accelerator (FTA) control circuit coupled to the first bus terminal, the first FTA control circuit configured to detect a falling edge of the first signal on the first bus terminal having a voltage slope below a threshold and, in response, to accelerate a voltage decrease of the first signal on the first bus terminal;
a second RTA control circuit coupled to the second bus terminal, the second RTA control circuit configured to detect a rising edge of a second signal on the second bus terminal and, in response, to accelerate a voltage increase of the second signal on the second bus terminal;
a second FTA control circuit couple to the second bus terminal, the second FTA control circuit configured to detect a falling edge of the second signal on the second bus terminal having a voltage slope below the threshold and, in response, to accelerate a voltage decrease of the second signal on the second bus terminal.

12. The IC of claim 11, in which the first and second RTA control circuits have respective outputs, and the IC further includes:
a logic circuit having first and second logic circuit inputs coupled to respective outputs of the first and second RTA control circuits, the logic circuit having an output; and
a timer having an input coupled to the output of the logic circuit, the timer having first and second timer outputs.

13. The IC of claim 12, further including:
a first driver having an input and an output, the output of the first driver coupled to the first bus terminal, the first timer output coupled to the input of the first driver;
a second driver having an input and an output, the output of the second driver coupled to the second bus terminal, the second timer output coupled to the input of the second driver.

14. The IC of claim 11, in which:
the first FTA control is configured to detect a voltage of the first signal on the first bus terminal has fallen below a first threshold; and
in response to one logic state of a first control signal, the first RTA control circuit is configured to detect that the voltage of the first signal on the first bus terminal has fallen below a second threshold smaller than the first threshold and, in response to another logic state of the first control signal, the first RTA control circuit is configured to detect that the voltage of the first signal on the first bus terminal has risen above a third threshold, the third threshold being between the first and second thresholds.

15. The IC claim 11, further including:
a first transistor coupled between the first bus terminal and a ground, the first transistor having a first control input; and
a second transistor coupled between the first bus terminal and the ground, the second transistor having a second control input;
the first FTA control circuit includes a first timer configured to generate a first timer pulse signal to the first control input to accelerate a falling edge of the voltage of the first signal on the first bus terminal; and
the second FTA control circuit includes a first timer configured to generate a second timer pulse signal to the second control input to accelerate a falling edge of the voltage of the first signal on the second bus terminal.

16. The IC of claim 11, in which each of the first and second FTA control circuits includes a down pulse timer configured to generate a timer-based control pulse during an acceleration of a falling edge of the voltage of the first signal to prevent the respective RTA control circuit from attempting to accelerate a rising edge.

17. An integrated circuit (IC), comprising:
a first terminal;
a driver having a driver input and a driver output, the driver output coupled to the first terminal;
a first control circuit having an input coupled to the first terminal and having an output, the first control circuit configured to: (a) during a rising edge, detect that a voltage on the first terminal has risen above a first threshold and to assert a control signal on its output to cause the driver to accelerate a rise in the voltage, and (b) during a falling edge, detect that the voltage on the first terminal is below a second threshold, second threshold smaller than the first threshold;
a first transistor coupled between the first terminal and a ground, the first transistor having a control input; and
a second control circuit coupled to the first terminal and to the control input of the first transistor, the second control circuit configured to detect a falling edge on the first terminal and, in response to detecting the falling edge, to generate a control signal for the control input to turn on the first transistor to force a voltage on the first terminal to decrease at a faster rate than the detected falling edge.

18. The IC of claim 17, in which the second control circuit includes a timer configured to prevent the second control circuit from generating the control signal to turn on the first transistor responsive to voltage on the first terminal being below the second threshold upon expiration of the timer.

19. The IC of claim 17, in which the second control circuit also has a hold-off control output coupled to the first control circuit to prevent the first control circuit from causing the driver to accelerate a rising edge.

20. The IC of claim 17, further including a timer coupled between the first control circuit and the driver, the timer configured to cause the driver to accelerate the rise in the voltage for a period of time implemented by the timer.

\* \* \* \* \*